(12) United States Patent
Christian et al.

(10) Patent No.: US 9,204,533 B2
(45) Date of Patent: Dec. 1, 2015

(54) ASYMMETRICAL MULTILAYER SUBSTRATE, RF MODULE, AND METHOD FOR MANUFACTURING ASYMMETRICAL MULTILAYER SUBSTRATE

(71) Applicant: Samsung Electro-Mechanics Co., Ltd., Suwon-si (KR)

(72) Inventors: Romero Christian, Suwon-si (KR); Seung Wook Park, Seoul (KR); Young Do Kweon, Seoul (KR); Mi Jin Park, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 352 days.

(21) Appl. No.: 13/664,358

(22) Filed: Oct. 30, 2012

(65) Prior Publication Data

US 2013/0106528 A1 May 2, 2013

(30) Foreign Application Priority Data

Oct. 31, 2011 (KR) .................... 10-2011-0112389
Oct. 22, 2012 (KR) .................... 10-2012-0117043

(51) Int. Cl.
| | | |
|---|---|---|
| *H03H 7/38* | (2006.01) |
| *H05K 3/00* | (2006.01) |
| *H05K 1/02* | (2006.01) |
| *H05K 1/16* | (2006.01) |
| *H05K 3/46* | (2006.01) |

(52) U.S. Cl.
CPC .............. *H05K 1/0251* (2013.01); *H05K 1/162* (2013.01); *H05K 3/4602* (2013.01); *H05K 2201/09336* (2013.01)

(58) Field of Classification Search
CPC ..................................................... H05K 1/0251
USPC ............................................................. 333/33
See application file for complete search history.

(56) References Cited

U.S. PATENT DOCUMENTS

| | | | |
|---|---|---|---|
| 7,030,712 B2* | 4/2006 | Brunette et al. ................ 333/33 |
| 7,492,146 B2* | 2/2009 | Behziz ..................... 324/756.06 |
| 8,085,112 B2* | 12/2011 | Kushta et al. .................... 333/33 |
| 2002/0155661 A1* | 10/2002 | Massingill et al. ........... 438/244 |

(Continued)

FOREIGN PATENT DOCUMENTS

| | | |
|---|---|---|
| KR | 1020060029457 A | 4/2006 |
| KR | 10-2007-0027017 A | 3/2007 |

(Continued)

*Primary Examiner* — Stephen E Jones
*Assistant Examiner* — Scott S Outten
(74) *Attorney, Agent, or Firm* — NSIP Law

(57) ABSTRACT

Disclosed herein are an asymmetrical multilayer substrate, an RF module, and a method for manufacturing the asymmetrical multilayer substrate. The asymmetrical multilayer substrate includes a core layer, a first pattern layer formed on one side of the core layer and including a first signal line pattern, a second pattern layer formed on the other side and including a second metal plate and a second routing line pattern, a first insulating layer thinner than the core layer formed on the second pattern layer and including a first via, and a third pattern layer formed on the first insulating layer and including a third signal line pattern, wherein an impedance transformation circuit including an impedance load and a parasitic capacitance load on the transmission line is formed for impedance matching in signal transmission between the signal line patterns formed in the upper and lower side directions of the core layer.

20 Claims, 9 Drawing Sheets

(56) References Cited

U.S. PATENT DOCUMENTS

| | | |
|---|---|---|
| 2003/0213619 A1 | 11/2003 | Denzene et al. |
| 2004/0136169 A1* | 7/2004 | Morimoto et al. ............ 361/780 |
| 2005/0178585 A1* | 8/2005 | Kim et al. .................... 174/262 |
| 2005/0231927 A1* | 10/2005 | Masuyama et al. ............ 361/783 |
| 2006/0043572 A1* | 3/2006 | Sugimoto et al. ............. 257/700 |
| 2006/0214744 A1* | 9/2006 | Margomenos ................. 333/33 |
| 2009/0133913 A1* | 5/2009 | Kushta et al. ................. 174/260 |
| 2010/0019859 A1* | 1/2010 | Lascari .......................... 333/33 |

FOREIGN PATENT DOCUMENTS

| | | |
|---|---|---|
| KR | 10-2007-0047926 A | 5/2007 |
| KR | 10-2008-0037468 A | 4/2008 |
| KR | 10-2010-0019781 A | 2/2010 |

* cited by examiner

ASYMMETRICAL MULTILAYER SUBSTRATE, RF MODULE, AND METHOD FOR MANUFACTURING ASYMMETRICAL MULTILAYER SUBSTRATE

CROSS REFERENCE(S) TO RELATED APPLICATIONS

This application claims the benefit under 35 U.S.C. Section 119 of Korean Patent Application Serial No. 10-2011-0112389, entitled "Asymmetrical multilayer Substrate, RF Module, and Method for Manufacturing the asymmetrical multilayer Substrate" filed on Oct. 31, 2011, and Korean Patent Application Serial No. 10-2012-0117043, entitled "Asymmetrical multilayer Substrate, RF Module, and Method for Manufacturing the asymmetrical multilayer Substrate" filed on Oct. 22, 2012, which are hereby incorporated by reference in its entirety into this application.

BACKGROUND OF THE INVENTION

1. Technical Field

The present invention relates to an asymmetrical multilayer substrate, an RF module, and a method for manufacturing the asymmetrical multilayer substrate, and more particularly, to an asymmetrical multilayer substrate having odd layers of asymmetric structure and forming in high density, an RF module, and a method for manufacturing the asymmetrical multilayer substrate which have an asymmetric structure.

2. Description of the Related Art

Increases in the processing speed and complexity of logic and RF circuits in electronic products, for example, electronic mobile devices maintain a significant trade-off relationship among requirements for costs, material selection, manufacturability, and perfection of signals. In most cases, only two among these requirements are easily achieved in a single design. In the final product, impact of the trade-off requires consideration for the number of stacked-up layers, and requires impedance matching of an overall thickness and transmission lines.

In the typical manufacturing process, a multi-layered substrate is configured of the symmetric number of stacked redistribution layers such as 2-layer, 4-layer, and 6-layer, which are made of a conductive metal reinforced with a typical genetic material, and is realized in a manner such that a ground reference for signal lines and power lines are generated as a pair in order to suppress an EMI (Electro Magnetic Interference). In order to design a high-specification performance package having a small form factor, a plurality of layers are increased to receive a plurality of I/O without compromising system noise, RF loss, and timing margin.

A typical design issue in an HDI substrate is the crosstalk between a plurality of high-speed I/O and I/Q data. This is mainly caused by discontinuity of return paths typically due to impedance mismatch between source and load, and absence of an appropriate reference ground structure. In the typical HDI substrate, this issue may be solved by inserting more layers used as a ground surface on a signal/RF interconnection layer; however, the insertion of the layers may cause an increase in the entire number of substrate build-up, a material thickness, and overall manufacturing costs.

SUMMARY OF THE INVENTION

An object of the present invention is to provide an asymmetrical multilayer substrate having odd pattern layers of asymmetric structure and forming in high density, an RF module using the asymmetrical multilayer substrate, and a method for manufacturing the asymmetrical multilayer substrate.

According to an exemplary embodiment of the present invention, there is provided an asymmetrical multilayer substrate, including: a core layer in which a through-hole for passing through and connecting upper and lower portions thereof is formed; a first pattern layer formed on one of upper and lower portions of the core layer, and including a first signal line pattern connected with the through-hole; a second pattern layer formed on the other of the upper and lower portions of the core layer, and including a second metal plate providing a capacitance between itself and a pattern of an adjacent outer pattern layer and a second routing line pattern connected with the through-hole; a first insulating layer formed on the second pattern layer so as to have a thinner thickness than a thickness of the core layer, and including a first via connected with the second routing line pattern; and a third pattern layer formed on the first insulating layer, and including a third signal line pattern connected with the first via, wherein an impedance transformation circuit including an impedance load on a transmission line and a parasitic capacitance load on the transmission line is formed for impedance matching in signal transmission between the signal line patterns formed in the upper and lower side directions of the core layer, and the impedance load includes impedances of the through-hole, the second routing line pattern, and the first via which are forming the transmission line, and the parasitic capacitance load includes the capacitance provided by the second metal plate.

In this instance, the asymmetrical multilayer substrate may further include a predetermined build-up structure is alternately laminated in a vertical direction with respect to the core layer for each times while being laminated by N−1 times along with an increase in N being a natural number of 2 or more, wherein the predetermined build-up structure including a (2N−2)-th insulating layer formed on a (2N−3)-th pattern layer so as to have a thinner thickness than the thickness of the core layer and including a (2N−2)-th via connected with a (2N−3)-th signal line pattern included in the (2N−3)-th pattern layer, a 2N-th pattern layer formed on the (2N−2)-th insulating layer and including a 2N-th routing line pattern connected with the (2N−2)-th via and a 2N-th metal plate providing a ground, a (2N−1)-th insulating layer formed on the 2N-th pattern layer so as to have a thinner thickness than the thickness of the core layer and including a (2N−1)-th via connected with the 2N-th routing line pattern, and a (2N+1)-th pattern layer formed on the (2N−1)-th insulating layer and including a (2N+1)-th signal line pattern connected with the (2N−1)-th via, and wherein asymmetrical layers of 2N+1 layers may be formed by the first to the (2N+1)-th pattern layers.

Also, the impedance load on the transmission line may be an impedance load by at least two vias including the first via, at least one routing line pattern including the second routing line pattern, at least one signal line pattern, and the through-hole which are formed on a routing line between signal line patterns forming input and output terminals of the signal transmission, and the parasitic capacitance load on the transmission line may be capacitance loads by the capacitance provided by the second metal plate and capacitances provided by at least one metal plate providing the grounds between itself and the signal line patterns forming the input and output terminals of the signal transmission.

Also, the impedance of each of the first signal line pattern and the second routing line pattern which are formed on the upper and lower portions of the core layer may be smaller than an impedance of the third signal line pattern formed on the first insulating layer.

Also, the first pattern layer may further include a first metal plate facing the second metal plate, and the parasitic capacitance load may be a parallel parasitic capacitance load of first and second capacitances formed between the second metal plate and each of the third signal line pattern and the first meal plate.

Also, the second metal plate may form a ground with respect to the third signal line pattern.

Also, the parasitic capacitance load may be a parallel capacitance formed between the second metal plate and each of the third and first signal line patterns.

Also, the first pattern layer may further include a first metal plate facing the second metal plate, the parasitic capacitance load may be a parallel parasitic capacitance load of first and second capacitances formed between the second metal plate and each of the third signal line pattern and the first metal plate, the third pattern layer may further include a third metal plate providing a capacitance between itself and the second routing line pattern, and an impedance of each of the first signal line pattern and the second routing line pattern may be smaller than an impedance of the third signal line pattern.

Also, the third signal line pattern may form a micro-strip line together with the second metal plate, and the third metal plate may be formed to adjust an impedance of the second routing line pattern constant.

Also, a width of each of the second metal plate and the first metal plate may be larger than a width of the third signal line pattern.

Also, the asymmetrical multilayer substrate may be used in a mobile device.

According to another exemplary embodiment of the present invention, there is provided an RF module which uses an asymmetrical multilayer substrate in which an RF signal transmission line is formed, the asymmetrical multilayer substrate including: a core layer in which a through-hole for passing through and connecting upper and lower portions thereof is formed; a first pattern layer formed on one of upper and lower portions of the core layer, and including a first signal line pattern connected with the through-hole; a second pattern layer formed on the other of the upper and lower portions of the core layer, and including a second metal plate providing a capacitance between itself and a pattern of an adjacent outer pattern layer and a second routing line pattern connected with the through-hole; a first insulating layer formed on the second pattern layer so as to have a thinner thickness than a thickness of the core layer, and including a first via connected with the second routing line pattern; and a third pattern layer formed on the first insulating layer, and including a third signal line pattern connected with the first via, wherein an impedance transformation circuit including an impedance load on a transmission line and a parasitic capacitance load on the transmission line is formed for impedance matching in signal transmission between the signal line patterns formed in the upper and lower side directions of the core layer, and the impedance load includes impedances of the through-hole, the second routing line pattern, and the first via which are forming the transmission line, and the parasitic capacitance load includes the capacitance provided by the second metal plate.

In this instance, the first pattern may further include a first metal plate facing the second metal plate, the parasitic capacitance load may be a parallel parasitic capacitance load of first and second capacitances formed between the second metal plate and each of the third signal line pattern and the first metal plate, the third pattern layer may include a third metal plate providing a capacitance between the third signal line pattern and the second routing line pattern, and an impedance of each of the first signal line pattern and the second routing line pattern may be smaller than an impedance of the third signal line pattern.

According to still another exemplary embodiment of the present invention, there is provided a method for manufacturing an asymmetrical multilayer substrate, the method including: preparing a core layer in which a through-hole for passing through and connecting upper and lower portions thereof is formed; forming, on one of upper and lower portions of the core layer, a first pattern layer including a first signal line pattern connected with the through-hole; forming, on the other of the upper and lower portions of the core layer, a second pattern layer including a second metal plate providing a capacitance between itself and a pattern of an adjacent outer pattern layer and a second routing line pattern connected with the through-hole; forming, on the second pattern layer, a first insulating layer having a thinner thickness than a thickness of the core layer; and forming a first via passing through the first insulating layer to be connected with the second routing pattern, and forming a third pattern layer, on the first insulating layer, a third pattern layer including a third signal line pattern connected with the first via, wherein an impedance transformation circuit including an impedance load on a transmission line and a parasitic capacitance load on the transmission line is formed for impedance matching in signal transmission between the signal line patterns formed in the upper and lower side directions of the core layer, and the impedance load includes impedances of the through-hole, the second routing line pattern, and the first via which are forming the transmission line, and the parasitic capacitance load includes the capacitance provided by the second metal plate.

In this instance, the method may further include laminating a predetermined build-up structure on an outermost pattern layer of a lamination previously laminated for each times while alternately laminating the predetermined build-up structure by N−1 times along with an increase in N being a natural number of 2 or more. In this instance, the one-time laminating of the predetermined build-up structure may include forming a (2N−2)-th insulating layer on a (2N−3)-th pattern layer being the outermost pattern layer so as to have a thinner thickness than a thickness of the core layer, forming a (2N−2)-th via passing through the (2N−2)-th insulating layer and connected with a (2N−3)-th signal line pattern included in the (2N−3)-th pattern layer, and forming 2N-th pattern layer, on the (2N−2)-th insulating layer, including a 2N-th routing line pattern connected with the (2N−2)-th via and a 2N-th metal plate providing a ground, forming, on the 2N-th pattern layer, a (2N−1)-th insulating layer having a thinner thickness than the thickness of the core layer, and forcing a (2N−1)-th via passing through the (2N−1)-th insulating layer and connected with the 2N-th routing line pattern, and a (2N+1)-th pattern layer, on the (2N−1)-th insulating layer, a (2N+1)-th pattern layer including a (2N+1)-th signal line pattern connected with the (2N−1)-th via, and wherein the insulating layers having the same sequence number in the upper and lower side directions with respect to the core layer are simultaneously or sequentially laminated, the pattern layers having the same sequence number in the upper and lower side directions are sequentially laminated, and asymmetrical layers of 2N+1 layers are formed by the first to the (2N+1)-th pattern layers.

Also, the impedance load on the transmission line may be an impedance load by at least two vias including the first via, at least one routing line pattern including the second routing line pattern, at least one signal line pattern, and the through-hole which are formed on a routing line between signal line patterns forming input and output terminals of the signal transmission, and the parasitic capacitance load on the transmission line may be capacitance loads by the capacitance provided by the second metal plate and capacitances provided by at least one metal plate providing the grounds between itself and the signal line patterns forming the input and output terminals of the signal transmission.

Also, the impedance of each of the first signal line pattern and the second routing line pattern which are formed on the upper and lower portions of the core layer may be smaller than an impedance of the third signal line pattern formed on the first insulating layer.

Also, the second metal plate may form a ground with respect to the third signal line pattern.

Also, in the forming of the first pattern layer, the first pattern layer may further include a first metal plate facing the second metal plate, in the forming of the third pattern layer, the third pattern layer may further include a third metal plate providing a capacitance with the second routing line pattern, and an impedance of the third signal line pattern of the third pattern layer may be larger than an impedance of each of the first signal line pattern and the second routing line pattern, and the parasitic capacitance load in which a first capacitance formed between the third signal line pattern of the third pattern layer and the second metal plate and a second capacitance formed between the second metal plate and the first metal plate may be parallel to each other is formed.

Also, in the forming of the third pattern layer, the third signal line pattern may form a micro-strip line together with the second metal plate, and the third metal plate may be formed to adjust an impedance of the second routing line pattern constant.

DESCRIPTION OF THE PREFERRED EMBODIMENTS

Figure 1:
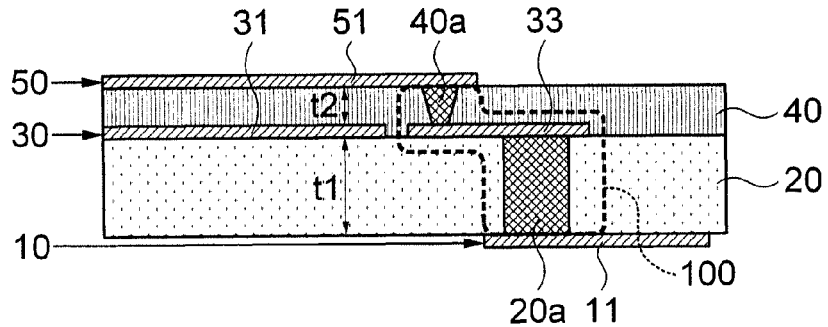
FIG. 1 is a cross-sectional diagram schematically showing an asymmetrical multilayer substrate according to an exemplary embodiment of the present invention.

Exemplary embodiments of the present invention for accomplishing the above-mentioned objects will be described with reference to the accompanying drawings. In describing exemplary embodiments of the present invention, the same reference numerals will be used to describe the same components and an additional description that is overlapped or allow the meaning of the present invention to be restrictively interpreted will be omitted.

It will be understood that when an element is simply referred to as being 'connected to' or 'coupled to' another element without being 'directly connected to' or 'directly coupled to' another element in the present description, it may be 'directly connected to' or 'directly coupled to' another element or be connected to or coupled to another element, having the other element intervening therebetween. In addition, in the specification, spatially relative terms, 'on', 'above', 'upper', 'below', 'lower', or the like, they should be interpreted as being in a 'direct-contact' shape or a shape in which other elements may be interposed therebetween, without a description that an element is in a 'direct-contact' with an object to be a basis. Furthermore, the spatially relative terms, 'on', 'above', 'upper', 'below', 'lower', or the like, may be used for describing a relationship of an element for another element. In this case, when a direction of the element to be a basis is reversed or changed, the spatially relative terms may include concept for directions of relative terms corresponding thereto.

Although a singular form is used in the present description, it may include a plural form as long as it is opposite to the concept of the present invention and is not contradictory in view of interpretation or is used as clearly different meaning. It should be understood that "include", "have", "comprise", "be configured to include", and the like, used in the present description do not exclude presence or addition of one or more other characteristic, component, or a combination thereof.

In addition, the drawings referred to in the specification are ideal views for explaining embodiments of the present invention. In the drawings, the sizes, the thicknesses, or the like of films, layers, regions or the like may be exaggerated for clarity.

In the present specification, a first, a second, a third, a fourth, a fifth, a (2N+1)-th, and the like do not indicate the ranking or the chronological relationships between components, and are merely terminologies for distinguishing each component from the other components.

First, an asymmetrical multilayer substrate according to first exemplary embodiments of the present invention will be described in detail with reference to the accompanying drawings.

Figure 2:
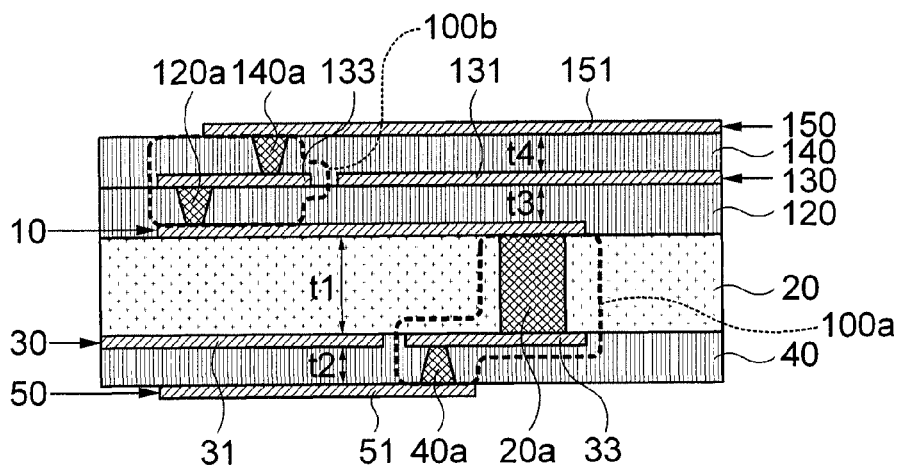
FIG. 2 is a cross-sectional diagram schematically showing an asymmetrical multilayer substrate according to another exemplary embodiment of the present invention.
Figure 3:
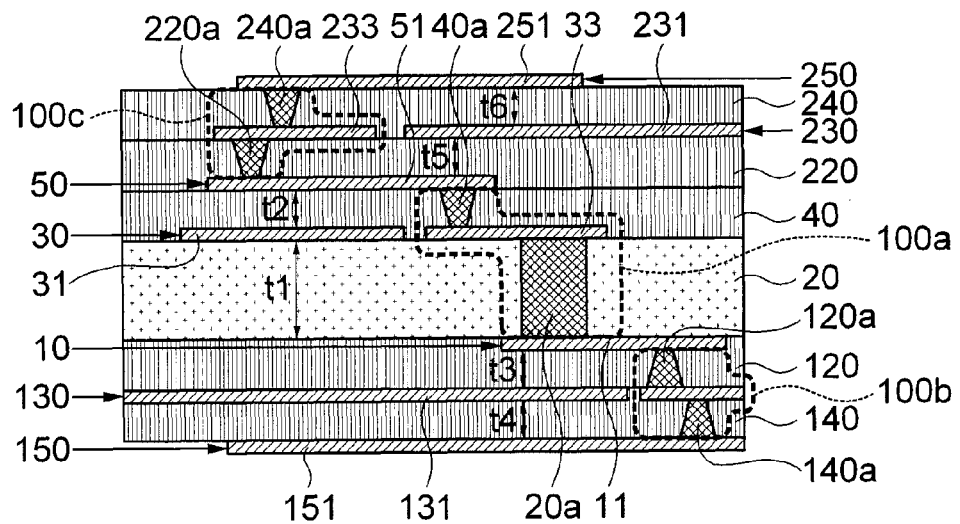
FIG. 3 is a cross-sectional diagram schematically showing an asymmetrical multilayer substrate according to another exemplary embodiment of the present invention.
Figure 4A:
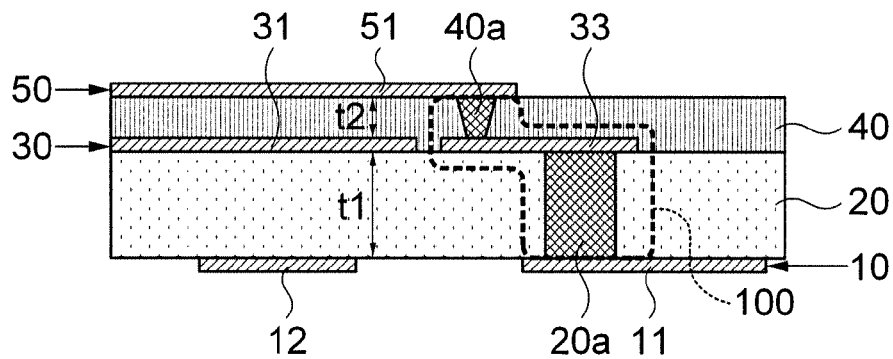
FIG. 4A is a cross-sectional diagram schematically showing an asymmetrical multilayer substrate according to an exemplary embodiment of the present invention.
Figure 4B:
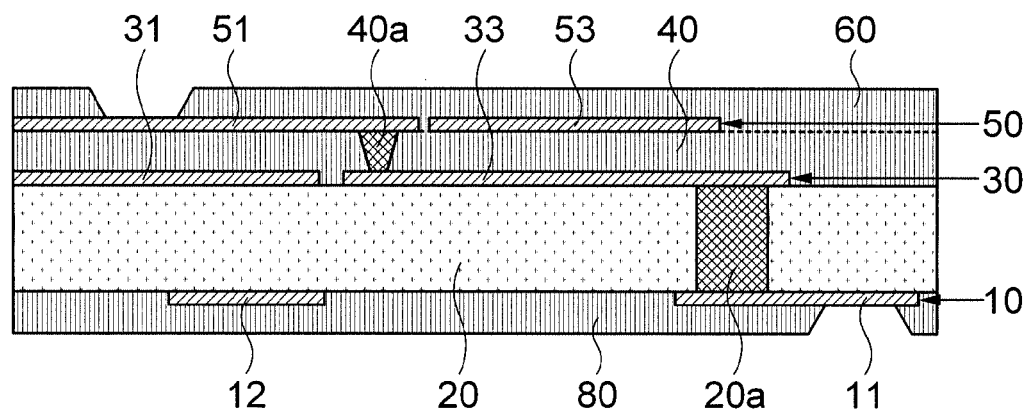
FIG. 4B is a cross-sectional diagram schematically showing an asymmetrical multilayer substrate according to an exemplary embodiment of the present invention.
Figure 5:
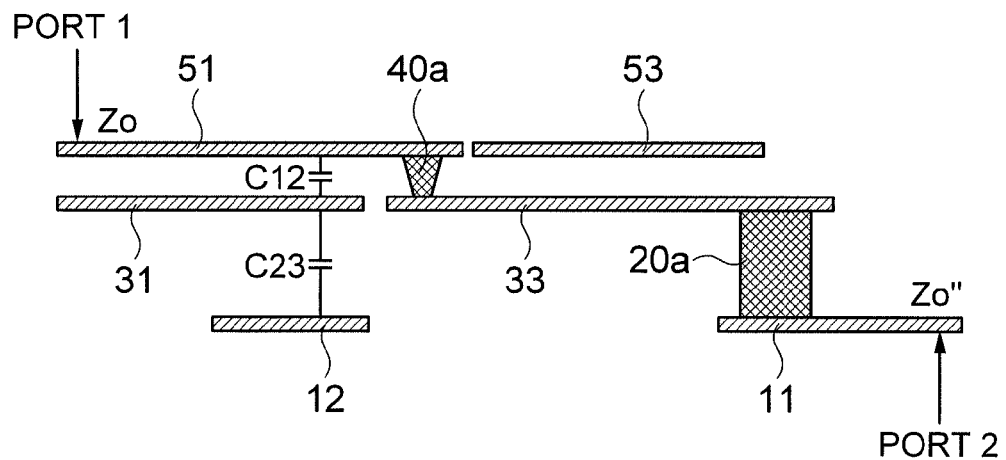
FIG. 5 is a cross-sectional diagram schematically showing a metal pattern layer of an asymmetrical multilayer substrate according to FIG. 4B.
Figure 6:
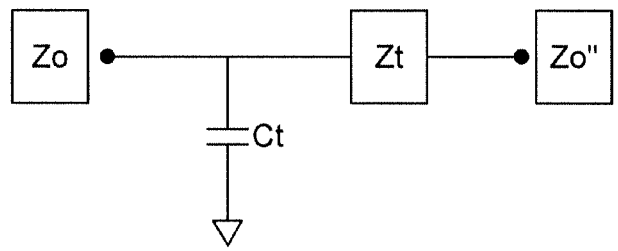
FIG. 6 is a circuit diagram schematically showing impedance transformation in an asymmetrical multilayer substrate according to an exemplary embodiment of the present invention.
Figure 7A:
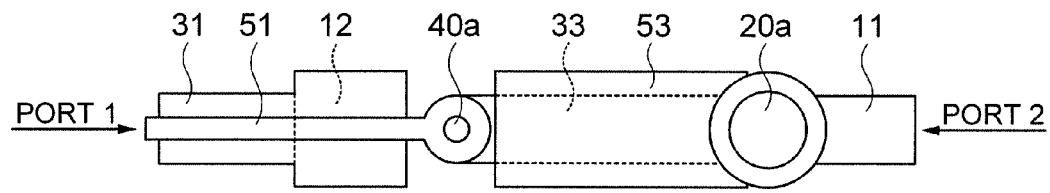
FIGS. 7A and 7B are diagrams schematically showing a metal pattern layer of an asymmetrical multilayer substrate according to an exemplary embodiment of the present invention.
Figure 7B:
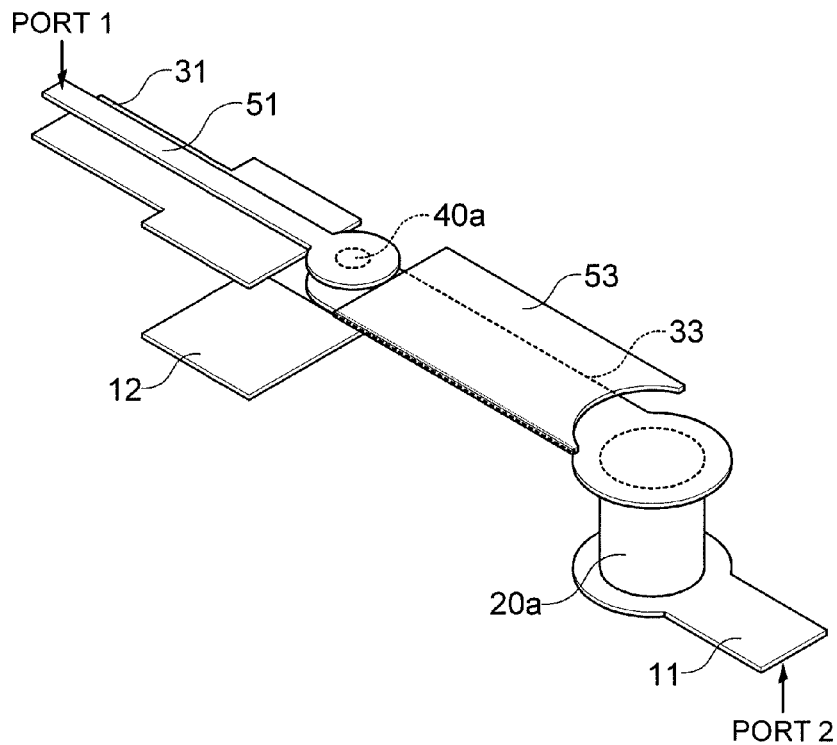

FIG. 1 is a cross-sectional diagram schematically showing an asymmetrical multilayer substrate according to an exemplary embodiment of the present invention, FIG. 2 is a cross-sectional diagram schematically showing an asymmetrical multilayer substrate according to another exemplary embodiment of the present invention, FIG. 3 is a cross-sectional diagram schematically showing an asymmetrical multilayer substrate according to another exemplary embodiment of the present invention, FIG. 4A is a cross-sectional diagram schematically showing an asymmetrical multilayer substrate according to an exemplary embodiment of the present invention, FIG. 4B is a cross-sectional diagram schematically showing an asymmetrical multilayer substrate according to an exemplary embodiment of the present invention, FIG. 5 is a cross-sectional diagram schematically showing a metal pattern layer of an asymmetrical multilayer substrate according to FIG. 4B, FIG. 6 is a circuit diagram schematically showing impedance transformation in an asymmetrical multilayer substrate according to an exemplary embodiment of the present invention, FIG. 7A is a diagram schematically showing a metal pattern layer of an asymmetrical multilayer substrate according to an exemplary embodiment of the present invention, and FIG. 7B is a perspective diagram schematically showing a metal pattern layer of an asymmetrical multilayer substrate according to an exemplary embodiment of the present invention.

Embodiments of the asymmetrical multilayer substrate according to the present invention will be described with reference to FIGS. 1 to 6. In this instance, FIGS. 1, 4A, 4B, and 5 show an example of an asymmetrical multilayer substrate with a pattern layer of a three-layered structure, FIG. 2 shows an example of a five-layered structure, and FIG. 3 shows an example of a seven-layered structure. In addition, FIG. 6 shows an impedance transformation circuit.

Referring to FIGS. 1 to 5, the asymmetrical multilayer substrate according to the first embodiment of the present invention includes a core layer 20, a first pattern layer 10, a second pattern layer 30, a first insulating layer 40 and a third pattern layer 50. In this instance, a first insulating layer 40 is formed between the third pattern layer 50 and the second pattern layer 30. As an example, the asymmetrical multilayer substrate may be applied to a substrate of an RF module to thereby be used in mobile devices.

Hereinafter, the core layer 20, the first pattern layer 10, the second pattern layer 30, the first insulating layer 40 and the third pattern layer 50 will be described in the stated order.

Referring to FIGS. 1 to 4B, the core layer 20 includes a through-hole 20a penetrating and connecting the upper and lower thereof. The core layer 20 may be formed thickly than the thickness of the first insulating layer 40. In this instance, the core layer 20 separates the second pattern layer 30 and the third pattern layer 50 from the first pattern layer 10. As an example, the core layer 20 may include a core made of a generic material or a low-loss material, but not restricted. The core layer 20 may be formed with a dielectric material that is thicker than the first insulating layer 40 in order to electrically separate pattern layers formed over and below thereof. In FIG. 5, a layer in which the through-hole 20a is formed may correspond to the core layer 20.

Also, the through-hole 20a may be formed such that an inner surface of a hole of the through-hole 20a is coated with a conductive material, or the overall hole thereof is filled with the conductive material. In this instance, the conductive material may be a material which is used in coating or filling of the via in the laminated substrate. For example, Al, Cu, Ag, and the like may be used, however, the present invention is not limited thereto. As an example, Cu may be used as the conductive material.

Referring to FIGS. 1 to 4B, the first pattern layer 10 is formed over or below the core layer 20. Hereinafter, as shown in FIGS. 1, 3, 4A, and 4B, an example in which the first pattern layer 10 is formed below the core layer 20 will be mainly described, but as shown in FIG. 2, the first pattern layer 10 may be formed on the core layer 20. In this instance, the first pattern layer 10 includes a first signal line pattern 11 connected with the through-hole 20a formed on the core layer 20. In this instance, the first pattern layer 10 may be formed using a conductive material which is used in a metal pattern of the laminated substrate. As the conductive material, for example, Cu may be used, however, the present invention is not limited thereto. As an example, referring to an example of a three-layered structure, in the first pattern layer 10, configurations having high thermal dissipation factors may be disposed. Also, referring to an example of a three-layered structure, since the first pattern layer 10 is disposed at one side of the core layer 20 opposite to the second and third pattern layers 30 and 50, the first pattern layer 10 may be less sensitive to noise in comparison with the third pattern layer 50 and the second pattern layer 30.

Referring to FIGS. 1 to 4B, the first signal line pattern 11 of the first pattern layer 10 is connected with the through-hole 20a of the core layer 20. The first signal line pattern 11 performs signal transmission with a second routing line pattern 33 of the second pattern layer 30 through the through-hole 20a. As an example, the first signal line pattern 11 may receive signals from the second routing line pattern 33 through the through-hole 20a. For example, the first signal line pattern 11 may transmit the transmitted signals to the outside through a metal pattern port. In this instance, the metal pattern port may be a terminal that is connected with the outside. For example, the first signal line pattern 11 may be a wiring pattern that transmits the transmitted signals to the outside through the metal pattern port, and may be, for example, a PDN (Power Distribution Network) pattern or another signal wiring pattern. For example, in a three-layered structure of FIGS. 1, 4A, 4B and 5, the first signal line pattern 11 may be a power line that is, the PDN pattern, and the third signal line pattern 51 may be an RF signal line.

Also, as an example, an impedance of the first signal line pattern may be smaller than an impedance of the third signal line pattern 51 of the third pattern layer 50. The first signal line pattern 11 of the first pattern layer 10 may include a stripe line. In this instance, a width of the first signal line pattern 11 may be larger than a width of the third signal line pattern 51.

Also, referring to FIGS. 4A, 4B, 5, 7A and 7B, the first pattern layer 10 may further include the first metal plate 12 opposite to the second metal plate 31. In this instance, the first metal plate 12 of the first pattern layer 10 may be disposed to have a second capacitance (see, $C_{23}$ of FIG. 5) between a second metal plate 31 of the second pattern layer 30 and the first metal plate 12. For example, in FIG. 5, the second capacitance (see, $C_{23}$ of FIG. 5) may be a parasitic capacitance when transmitting signals from the third signal line pattern 51 to the first signal line pattern 11, and form a part of an impedance transformation circuit for impedance matching in the signal transmission between the third signal line pattern 51 and the first signal line pattern 11. The second capacitance (see, $C_{23}$ of FIG. 5) adjusts the overall parasitic capacitance in the signal transmission path between the third signal line pattern 51 and the first signal line pattern 11. In this instance, the first metal plate 12 may provide the second capacitance (see, $C_{23}$ of FIG. 5) between the second metal plate 31 and the first metal plate 12, and may be, for example, a ground pattern or another signal line pattern. For example, the first metal plate 12 may be used as both a ground and a power line, and may be a plane plate so as to form a second capacitance.

For example, the second capacitance formed between the first metal plate 12 and the second metal plate 31 may be parallel to the first capacitance formed between the second metal plate 31 and the third signal line pattern 51 to thereby form a parasitic capacitance load (see $C_t$ of FIG. 6) of the impedance transformation circuit on a signal transmission routing line between the third signal line pattern 51 and the first signal line pattern 11.

Also, a width of the first metal plate 12 may longer than that of the third signal line pattern 51. In this instance, the ratio of the width of the first metal plate 12 to a thickness of the core layer 20 or a height of the through-hole 20a may be about 1:1. In this instance, the width of the first metal plate 12 may be the same as that of the second metal plate 31. In this instance, as long as the second capacitance for adjusting the entire parasitic capacitance on the signal transmission routing line between the third signal line pattern 51 and the first signal line pattern 11 is formed, it is unnecessary that a ratio of the width of the first metal plate 12 is limited.

Next, referring to FIGS. 1 to 4B, the second pattern layer 30 is formed on the core layer 20. In this instance, the second pattern layer 30 may be formed on an opposite side of the first pattern layer 10 with respect to the core layer 20. The second pattern layer 30 includes the second metal plate 31 and the second routing line pattern 33. The second pattern layer 30 may be also made of a conductive material which is used in a metal pattern of the laminated substrate, similar to the first pattern layer 10. For example, the second pattern layer 30 may be formed using a metal of Cu material. The second routing line pattern 33 of the second pattern layer 30 may be connected with the through-hole 20a formed on the core layer 20. The second metal plate 31 provides a capacitance between the second metal plate 31 and a pattern of an adjacent outer pattern layer. The parasitic capacitance load provided by the second metal plate 31 may configure a part of a circuit for impedance matching in signal transmission between the third signal line pattern 51 and the first signal line pattern 11. For example, in this instance, the parasitic capacitance load may be a capacitance between the second metal plate 31 and the third signal line pattern 51, or referring to FIGS. 4B and 5, may be a parallel capacitance including a first capacitance between the second metal plate 31 and the third signal line pattern 51 and a second capacitance between the second metal plate 31 and the first metal plate 12. Alternatively, although not shown, the parasitic capacitance load may be a parallel capacitance between the second metal plate 31 with the third signal line pattern 51 and the first signal line pattern 11.

Referring to FIG. 5, the second metal plate 31 of the second pattern layer 30 provides a first capacitance (See, $C_{12}$ of FIG. 5) between the third signal line pattern 51 of the third pattern layer 50 and the second metal plate 31. The second metal plate 31 may provide improved impedance matching for the third signal line pattern 51 while providing closed-coupling with the signal line so that signals are transmitted to the first signal line pattern 11 of the first pattern layer 10 at a low impedance. For example, the second metal plate 31 may act as a ground for the third signal line pattern 51. For example, the second metal plate 31 is formed in a plane plate shape capable of providing a capacitance with the third signal line pattern 51, and for example, may be a power line or a ground pattern.

In this instance, the first capacitance (See $C_{12}$ of FIG. 5) generated between the second metal plate 31 and the third signal line pattern 51 may form a part of the impedance transformation circuit for impedance matching at the time of signal transmission from the third signal line pattern 51 to the first signal line pattern or the metal pattern port.

Also, referring to FIGS. 4A, 4B, 5, 7A and 7B, the second metal plate 31 may be disposed to have the second capacitance (see, $C_{23}$ of FIG. 5) between the second metal plate 31 and the first pattern layer 10, for example, the first metal plate 12. In this instance, the second capacitance (see, $C_{23}$ of FIG. 5) may form a parasitic capacitance at the time of signal transmission from the third signal line pattern 51 to the first signal line pattern 11, and adjust the overall parasitic capacitance. Accordingly, the second capacitance (see, $C_{23}$ of FIG. 5) may form a part of an impedance transformation circuit for impedance matching of the third signal line pattern 51 and the first signal line pattern 11.

As an example, the second metal plate 31 may form a micro-strip line together with the third signal line pattern 51 while acting as a ground with respect to the third signal line pattern 51 of the third pattern layer 50. Also, the width of the second metal plate 31 may be longer than that of the third signal line pattern 51.

Also, as an example, in a build-up structure according to the present embodiment, an aspect ratio of a width (W) of the metal pattern line to a thickness (T) of a dielectric material concerning the signal transmission of the metal pattern layer may be about 1:1. For example, the ratio of the width of the second metal plate 31 to a thickness of the core layer 20 or a height of the first via 40a may be about 1:1. Also, as an example, the width of the second metal plate 31 may be substantially the same as that of the first metal plate 12. In spite of the above-described example, since the parasitic capacitance load is formed to thereby match transmission impedance on the signal transmission routing line between the third signal line pattern 51 and the first signal line pattern 11, it is unnecessary that a ratio of the width of the second metal plate 31 is limited as long as impedance matching by the capacitance formed with other pattern layers is achieved.

Also, the second routing line pattern 33 of the second pattern layer 30 is connected with the through-hole 20a of the core layer 20. In this instance, the second routing line pattern 33 is connected with the first signal line pattern 11 of the first pattern layer 10 through the through-hole 20a. Also, the second routing line pattern 33 is connected with the third signal line pattern 51 of the third pattern layer 50 through the first via 40a formed in the first insulating layer 40 formed on the second pattern layer 30. Accordingly, the second routing line pattern 33 may perform signal transmission between the third signal line pattern 51 of the third pattern layer 50 and the first signal line pattern of the first pattern layer 10 or the metal pattern port through the first via 40a and the through-hole 20a. In this instance, the second routing line pattern 33 may be, for example, an I/O line pattern or another signal transmission line. For example, signals input through the third signal line pattern 51 may be transmitted to the first signal line pattern 11 of the first pattern layer 10 through the first via 40a, the second routing line pattern 33, and the through-hole 20a. In this instance, an impedance of each of the second routing line pattern 33 and the first signal line pattern 11 may be smaller than an impedance of the third signal line pattern 51 of the third pattern layer 50. Accordingly, signal transmission from the third signal line pattern 51 of the third pattern layer 50 to the first signal line pattern 11 of the first pattern layer 10 through the second routing line pattern 33 may be smoothly performed.

The second routing line pattern 33 and the third signal line pattern 51 may be the signal transmission line which is sensitive to noise. In this instance, a closed coupling with respect to the reference ground may be required to reduce an EMI and a noise level. Accordingly, in case of, for example, an asymmetric substrate having the three-layered structure, referring to FIGS. 4B, 5, 7A and 7B, the second routing line pattern 33 may achieve the closed coupling with the third metal plate 53 of the third pattern layer 50. Next, referring to FIGS. 1, 2, 3, 4A, 4B, 5, 7A and 7B, the third signal line pattern 51 may achieve the closed coupling with the second metal plate 31.

Also, referring to FIGS. 4B, 5, 7A and 7B, in the second routing line pattern 33 of the second pattern layer 30, a reduction in crosstalk and noise may be realized by a capacitance obtained due to the closed coupling with the third metal plate 53 of the third pattern layer 50.

The second routing line pattern 33 of the second pattern layer 30 may include a stripe line. In this instance, a width of each of the second routing line pattern 33 and the first signal line pattern 11 may be larger than a width of the third signal line pattern 51 so that each of the second routing line pattern 33 and the first signal line pattern 11 has an impedance smaller than that of the third signal line pattern 51.

Next, referring to FIGS. 1 to 4B, the first insulating layer 40 is formed on the second pattern layer 30 with the thickness t2 that is thinner than the thickness t1 of the core layer 30. The first insulating layer 40 is formed between the second pattern layer 30 and the third pattern layer 50. The thickness t1 of the core layer 20 is thick, whereas the thickness t2 of the first insulating layer 40 is as thin as possible for high-density lamination. Accordingly, tight electrical coupling formed between the third signal line pattern 51 and the second metal plate 31 each formed above and below the first insulating layer 40 is helpful in reducing the transmission impedance, and a common-mode EMI and crosstalk may be accordingly reduced. In addition, the first via 40a that conducts the second routing line pattern 33 of the second pattern layer 30 and the third signal line pattern 51 of the third pattern layer 50 is formed on the first insulating layer 40. As a material of the first insulating layer 40, a dielectric material used in the laminated substrate may be used. In this instance, a low dielectric constant (DK) passivation material may be used. In this instance, together with the second routing line pattern 33 and the through-hole 20a, the first via 40a may form an impedance load 100 or 100a that is a part of the impedance transformation circuit for impedance matching in the signal transmission between the third signal line pattern 51 and the first signal line pattern 11.

For example, the first insulating layer 40 between the second pattern layer 30 and the third pattern layer 50 may have a thickness ratio of about 1:1 with the width of the third signal line pattern 51 of the third pattern layer 50 but not restricted. In FIG. 5, a layer in which the first via 40a is formed corresponds to the first insulating layer 40. In this instance, an inner surface of the first via 40a may be coated with a conductive material used in coating or filling of the via of the laminated substrate, similar to the through-hole 20a, or the overall hole of the first via 40a may be filled with the well-known conductive material. In this instance, as the conductive material, for example, Al, Cu, Ag, and the like may be used, however, the present invention is not limited thereto.

Also, referring to FIGS. 1 to 4B, the third pattern layer 50 is formed on the first insulating layer 40. That is, the third pattern layer 50 may be formed on the first insulating layer 40 formed on the second pattern layer 30. In this instance, the third pattern layer 50 includes the third signal line pattern 51 connected with the first via 40a formed on the first insulating layer 40. The third pattern layer 50 may be made of a conductive material which is used in signal line patterns of the laminated substrate, similar to the second pattern layer 30 or the first pattern layer 10, for example, made of a metal of Cu material.

Referring to FIGS. 1 to 4B, the third signal line pattern 51 of the third pattern layer 50 is connected with the second routing line pattern 33 of the second pattern layer 30 through the first via 40a which is formed in the first insulating layer 40 between the second pattern layer 30 and the third pattern layer 50. In this instance, the third signal line pattern 51 may be, for example, an RF signal line which receives and transmits RF signals, or another signal transmission line. For example, the third signal line pattern 51 may transmit the transmitted signals to the second routing line pattern 33 via the first via 40a. Also, an impedance of the third signal line pattern 51 of the third pattern layer 50 may be larger than an impedance of each of the second routing line pattern 33 and the first signal line pattern 11. For example, the third signal line pattern 51 is a signal line which is sensitive to noise, so that a closed coupling for the reference ground may be required to reduce an EMI and a noise level. Accordingly, the third signal line pattern 51 may achieve the closed coupling with the second metal plate 31 of the second pattern layer 30. In this instance, the third signal line pattern 51 may have the first capacitance (see, $C_{12}$ of FIG. 5) between the second metal plate 31 and the third signal line pattern 51.

The third signal line pattern 51 of the third pattern layer 50 may include a stripe line. In this instance, the width of the third signal line pattern 51 may be smaller than the width of each of the second routing line pattern 33 and the first signal line pattern 11, so that the third signal line pattern 51 of the third pattern layer 50 has an impedance larger than that of each of the second routing line pattern 33 and the first signal line pattern 11. Also, in an asymmetric build-up structure according to an embodiment, an aspect ratio of the width (W) of the metal pattern line to the thickness (T) of the dielectric material concerning signal transmission of the metal pattern layer may be about 1:1. For example, the ratio of the width of the third signal line pattern 51 to the thickness between the third signal line pattern 51 and the second metal plate 31 or a height of the first via 40a may be about 1:1. In spite of the above-described example, since the capacitance between the third signal line pattern 51 and the second metal plate 31 is formed to match the transmission impedance on the signal transmission routing line between the third signal line pattern 51 and the first signal line pattern 11, it is unnecessary that a ratio of the width of the third signal line pattern 51 is limited as long as the impedance matching is achieved by the parasitic capacitance load including the capacitance between the third signal line pattern 51 and the second metal plate 41.

As another example, the third signal line pattern 51 may be formed into a strip shape in which a pattern width is small, thereby forming a micro-strip line together with the second metal plate 31 of the second pattern layer 30. In this instance, the first capacitance (see, $C_{12}$ of FIG. 5) may be formed between the third signal line pattern 51 and the second metal plate 31. The first capacitance (see, $C_{12}$ of FIG. 5) may be a parasitic capacitance at the time of signal transmission from the third signal line pattern 51 to the first signal line pattern 11. In this instance, the overall parasitic capacitance at the time of signal transmission may be adjusted by the second capacitance (see, $C_{23}$ of FIG. 5) between the second metal plate 31 and first metal plate 12, and may form a part of the impedance transformation circuit for impedance matching of the third signal line pattern 51 and the first signal line pattern 11.

Also, referring to FIGS. 4B, 5, 7A and 7B, the third pattern layer 50 may further include the third metal plate 53. In this instance, the third metal plate 53 of the third pattern layer 50 provides a predetermined capacitance between the second routing line pattern 33 of the second pattern layer 30 and the third metal plate 53. For example, the third metal plate 53 may act as a ground with respect to the second routing line pattern 33. The third metal plate 53 provides the capacitance between the second routing line pattern 33 and the third metal plate 53, and may be, for example, a ground pattern or another signal line. The predetermined capacitance is provided between the second routing line pattern 33 and the third metal plate 53, so that the third metal plate 53 may adjust an impedance of the second routing line pattern 33 of the second pattern layer 30 constant. In this instance, the third metal plate 53 may act as the ground with respect to the second routing line pattern 33 so as to adjust the impedance constant with respect to the overall length of the second routing line pattern 33.

As an example, the third metal plate 53 may have the same width as that of each of the second and first metal plates 31 and 12. In this instance, the ratio of the width of the third metal plate 53 to the thickness of the core layer 20 or the height of the through-hole 20a may be about 1:1.

In a typical asymmetric build-up structure, all impedance transformation of signal lines in an interconnection routing from the third pattern layer 50 to the first pattern layer 10 may incur mismatching, so that a part of the signals is reflected and returned as a source. As a result, a VSWR (Voltage Standing Wave Ratio) may be more deteriorated. This may incur a high signal loss in the overall interconnection routing, and occur substantial performance degradation in a signal transmission system. Therefore, impedance transformation of interconnection between layers may be required to be improved.

Meanwhile, FIG. 1 shows a basic structure of a basic asymmetric multilayer substrate including the core layer 20 made of a thick core material between the adjacent first and second patterns 10 and 30. Here, in the structure in which only the core layer 20 is thick, an inter-plane capacitance between the first signal line pattern 11 configuring a power line and the second metal plate 31 providing the ground may not be sufficient to provide appropriate decoupling in low frequencies. In addition, in such a shape, impedance mismatch becomes a main issue. Therefore, the decoupling is required to be realized using another method.

As a method of solving this problem, by improving mismatch of the transmission impedance which may be caused by interconnection formed on the routing of the signal transmission between the signal line patterns formed in the upper and lower side directions of the core layer, an impedance transformation circuit may be formed in order to match the impedance. In this instance, the impedance transformation circuit may include the impedance load 100 on the transmission routing line and the parasitic capacitance load on the transmission routing line in the signal transmission between the signal line patterns formed in the upper and lower side directions of the core layer 20. In this instance, the impedance load 200 may include the impedances of the through-hole 20a, the second routing line pattern 33, and the first via 40a, which are forming the transmission routing line. The parasitic capacitance load is used to implement a matching impedance by adjusting a capacitance value of the impedance transformation circuit, and may include a parasitic capacitance with respect to signal line pattern(s) formed in the upper or/and lower side directions of the core layer being composed of an input side or/and output side of signal transmission. For example, the parasitic capacitance load may include the capacitance provided by the second metal plate 31. In this instance, in the asymmetric structure of odd number of layers different from the prior art, measures of the transmission impedance and the EMI control impedance may be established by the impedance transformation circuit.

For example, referring to FIG. 6, in the present embodiment, in case that a signal transmission is accomplished between the third signal line pattern 51 and the first signal line pattern 11, an impedance transformation circuit for matching impedance of the third signal line pattern 51 with the first signal line pattern 11 may be provided. In this instance, referring to FIGS. 1 to 6, the impedance transformation circuit for impedance matching of between the third signal line pattern 51 and the first signal line pattern 11 may be formed by an impedance load 100 (see, Zt of FIG. 6) of through hole 20a, the second routing line pattern 33 and the first via 40a, and a parasitic capacitance load (see, Ct of FIG. 6) for example, provided by the second metal plate 31 for implementing the matching impedance by adjusting the capacitance value of the impedance transformation circuit. A partial pattern of the pattern layer, for example, the second routing line pattern 33 in a case of a three-layered structure, the second routing line pattern 33 and a signal line pattern in other pattern layers in a case of at least five-layered structure may be included in a transmission line impedance load constituting the impedance transformation circuit. In this instance, when the partial pattern of the pattern layer included in the transmission line impedance load has a predetermined length, a plane plate for providing a ground may be added on an upper or a lower pattern layer of a corresponding pattern layer in order to adjust an impedance of the partial pattern. For example, in FIG. 4B, the third metal plate is used for adjusting the impedance of the second routing line pattern 33.

In this instance, referring to FIGS. 4B, 5, 7A and 7B, as an example, the parasitic capacitance load configuring the impedance transformation circuit between the third signal line pattern 51 and the first signal line pattern 11 may be a parallel parasitic capacitance load including a first capacitance formed between the second metal plate 31 and the third signal line pattern 51 and a second capacitance formed between the second metal plate 31 and the first metal plate 12. The capacitance load (see Ct of FIG. 6) by the second metal plate 31 and the first metal plate 12 may correspond to a parallel capacitance of the first capacitance (see, $C_{12}$ of FIG. 5) between the second metal plate 31 and the third signal line pattern 51 and the second capacitance (see, $C_{23}$ of FIG. 5) between the second metal plate 31 and the first metal plate 12. In this instance, in FIG. 6, the capacitance load is $Ct=C_{12}//C_{23}$, and Zo>Zo" is satisfied between an impedance Zo of the third signal line pattern 51 and an impedance Zo" of the first signal line pattern 11.

For example, a third metal plate 53 acting as a ground with respect to the second routing line pattern 33 is further included, and therefore a predetermined capacitance is provided between the second routing line pattern 33 and the third metal plate 53, thereby adjusting the impedance of the second routing line pattern 33.

Also, as an example, as shown in FIG. 4B, in the asymmetric multilayer substrate having a three-layered structure, protection layers 60 and 80 for protecting patterns of the pattern layers may be formed. That is, the protection layers 60 and 80 made of an insulating material may be respectively formed above the third pattern layer 50 and below the first pattern layer 10. In this instance, the first insulating layer 40 between the second pattern layer 30 and the third pattern layer 50, the lower protection layer 80 of the first pattern layer 10, and the upper protection layer 60 of the third pattern layer 50 may be laminated, and then compressed. For example, in this instance, the protection layers 60 and 80 may include a metal land formed thereon and a via and/or an open via in the vicinity of a metal pad.

Although not shown, in the same manner as that of FIG. 4B, when the asymmetric multilayer substrate has a multi-layered structure of five layers or more, for example, even in the cases of FIGS. 2 and 3, an upper protection layer and a lower protection layer may be respectively formed on both outermost pattern layers.

Next, referring to FIGS. 2 and 3, the asymmetric multilayer substrate according to another embodiment will be described.

Referring to FIG. 2, the asymmetric multilayer substrate may further include a second insulating layer 120, a fourth pattern layer 130, a third insulating layer 140, and a fifth pattern layer 150. Referring to FIG. 3, the asymmetric multilayer substrate may further include a fourth insulating layer 220, a sixth pattern layer, a fifth insulating layer 240, and a seventh pattern layer 250 in addition to the structure of FIG. 2.

In this instance, a build-up structure in which the second insulating layer 120, the fourth pattern layer 130, the third insulating layer 140, and the fifth pattern layer 150, which are added in FIG. 2, are laminated may be repeatedly laminated in the similar manner even in FIG. 3. That is, referring to FIGS. 2 and 3, a predetermined build-up structure is alternately laminated in a vertical direction with respect to the core layer 20. For example, in FIG. 2, in the asymmetric multilayer substrate having pattern layers with a five-layered structure, the predetermined build-up structure is laminated on a side of the first pattern layer 10 of the core layer 20, and in a case of a seven-layered structure in FIG. 3, the predetermined build-up structure is laminated on the third pattern layer 50 opposite to the first pattern layer 10 with respect to the core layer 20. In other words, the predetermined build-up structure is alternately laminated in a vertical direction with respect to the core layer 20 for each times when the predetermined build-up structure is additionally laminated.

Referring to FIGS. 2 and 3, the predetermined build-up structure will be described. Hereinafter, N denotes a natural number of 2 or more. The predetermined build-up structure includes a (2N−2)-th insulating layer, a 2N-th pattern layer, a (2N−1)-th insulating layer, and a (2N+1)-th pattern layer. For example, when N=2, as shown in FIG. 2, the (2N−2)-th insulating layer may be the second insulating layer 120, the 2N-th pattern layer may be the fourth pattern layer 130, the (2N−1)-th insulating layer may be the third insulating layer 140, and the (2N+1)-th pattern layer may be the fifth pattern layer 150. When N=3, as shown in FIG. 3, the (2N−2)-th insulating layer may be the fourth insulating layer 220, the 2N-th pattern layer may be the sixth pattern layer 230, the (2N−1)-th insulating layer may be the fifth insulating layer 240, and the (2N+1)-th pattern layer may be the seventh pattern layer 250. Hereinafter, a general example of the predetermined build-up structure will be described with reference to FIG. 2, but may be applied in the same manner even with reference to FIG. 7.

First, in the predetermined build-up structure, the (2N−2)-th insulating layer is formed on the (2N−3)-th pattern layer so as to have a thinner thickness than a thickness of the core layer 20. For example, in FIG. 2, the second insulating layer 120 is formed on the first pattern layer 10, and in FIG. 3, the fourth insulating layer 220 is formed on the third pattern layer 50. In this instance, on the (2N−2)-th insulating layer, a (2N−2)-th via connected with a (2N−3)-th signal line pattern included in the (2N−3) pattern layer. Referring to FIG. 2, the second insulating layer 120 is formed on the first pattern layer 10 so as to have a thinner thickness t3 than the thickness t1 of the core layer 20, and on the second insulating layer 120, a second via 120a connected with the first signal line pattern 11 of the first pattern layer 10 is formed.

Next, the 2N-th pattern layer is formed on the (2N−2)-th insulating layer. For example, in FIG. 2, the fourth pattern layer 130 is formed on the second insulating layer 120, and in FIG. 3, the sixth pattern layer 230 is formed on the fourth insulating layer 220. In this instance, the 2N-th pattern layer includes a 2N-th routing line pattern and a 2N-th metal plate. The 2N-th routing line pattern is connected with a (2N−2)-th via formed on the (2N−2)-th insulating layer. Referring to FIG. 2, the fourth pattern layer 130 includes a fourth routing line pattern 133 and a fourth metal plate 131. The fourth routing line pattern 133 is connected with the second via 120a. Referring to FIG. 3, the seventh pattern layer 250 includes a seventh signal pattern 251 connected with the fifth via 240a.

In addition, the 2N-th metal plate provides a ground with respect to an adjacent pattern layer. In this instance, the 2N-th metal plate may shield the (2N+1)-th pattern layer from the 2N-th pattern layer. The 2N-th metal plate may be disposed so as to have predetermined capacitances with a (2N+1)-th signal line pattern of the (2N+1)-th pattern and with a (2N−3)-th signal line pattern of the (2N−3)-th pattern layer. Referring to FIG. 2, the fourth metal plate 131 may be provided as the ground between the adjacent fifth pattern layer 150 and first pattern layer 10 so as to the fifth pattern layer 150 and the first pattern layer 10. For example, the fourth metal plate 131 may form a predetermined capacitance through the third insulating layer 140 with the fifth signal line pattern 151, and may form a predetermined capacitance through the second insulating layer 120 with the first signal line pattern 11. For example, in the multi-layered structure of five layers or more, a high-speed transmission line may be embedded between two grounds by the 2N-th metal plate and the metal plate formed below or above the 2N-th metal plate, and shielding by the two grounds may be provided. In addition, in the multi-layered structure of five layers or more, in order to provide closed coupling for impedance control, an adjacent ground layer may be formed with respect to all signals and/or PDN line layers.

In addition, the (2N−1)-th insulating layer is formed on the 2N-th pattern layer so as to have a thinner thickness than a thickness of the core layer 20. In this instance, on the (2N−1)-th insulating layer, a (2N−1)-th via connected with the 2N-th routing line pattern is formed. Referring to FIG. 2, the third insulating layer 140 is formed on the fourth pattern layer 130 so as to have a thinner thickness t4 than the thickness t1 of the core layer 20, and a third via 140a connected with the fourth routing line pattern 133 is formed on the third insulating layer 140.

Next, the (2N+1)-th pattern layer is formed on the (2N−1)-th insulating layer. For example, in FIG. 2, the fifth pattern layer 150 is formed on the third insulating layer 140, and in FIG. 3, the seventh pattern layer 250 is formed on the fifth insulating layer 240. In this instance, the (2N+1)-th pattern layer includes a (2N+1)-th signal line pattern connected with the (2N−1)-th via. Referring to FIG. 2, the fifth pattern layer 150 includes a fifth signal line pattern 151 connected with the third via 140a. Referring to FIG. 3, the sixth pattern layer 230 includes a sixth routine line pattern 233 and a sixth metal plate 231. The sixth routing line pattern 233 is connected with the fourth via 220a.

Accordingly, the predetermined build-up structure is laminated by N−1 times along with an increase in N being a natural number of 2 or more, and asymmetrical layers of 2N+1 layers may be formed by the first to the (2N+1)-th pattern layer. In this instance, at least one of a plurality of signal line patterns may be a power distribution line.

For example, in FIG. 2, five-layered asymmetrical layer may be formed by the first to fifth pattern layers 50, 30, 10, 130, and 150. In this instance, one of the first, the third, and the fifth signal line patterns 11, 51, 151 may be a power distribution line. For example, the third signal line pattern 51 may be a power distribution network line, and the fifth signal line pattern 151 may be an RF signal line.

In this instance, as an example, the impedance load on the transmission line may be an impedance load by at least two vias including the first via 40a, at least one routing line pattern including the second routing line pattern 33, at least one signal line pattern, and the through-hole 20a, which are formed on a routing line between signal line patterns forming input and output terminals of the signal transmission. In addition, the parasitic capacitance load on the transmission line may be a capacitance load by the capacitance provided by the second metal plate 31 and capacitances provided by at least one metal plate providing the grounds between itself and the signal line patterns forming the input and output terminals of the signal transmission.

For example, in FIG. 2, when assuming a case of the signal transmission between the third signal line pattern 51 and the fifth signal line pattern 151, the impedance load may be formed by a first impedance load 100a by the first via 40a, the second routing line pattern 33, and the through-hole 20a, a second impedance load 100b by the second via 120a, the fourth routing line pattern 133, and the third via 140a, and an impedance load of the first signal line pattern 11. In addition, the parasitic capacitance load may be a load by a capacitance between the second metal plate 31 and the third signal line pattern 51 and capacitances between the fourth metal plate 131 and the fifth and first signal line patterns 151 and 11.

When a signal line, for example, I/O line is lengthened, additional consideration with a routing density is required. In this instance, as shown in FIG. 2, a predetermined number of pattern layers on any one side of the basic asymmetrical structure of FIG. 1, for example, the fourth and fifth pattern layers 130 and 150 may be laminated in FIG. 2. Accordingly, the asymmetrical multilayer substrate of the additional laminated structure may have a higher routing density, and have additional advantages with respect to EMI control. In an example of the five-layered structure shown in FIG. 2, two signal lines are formed on the first and fifth patter layers 10 and 150, the signal line pattern of the first pattern layer 10 is embedded between the fourth pattern layer providing the ground and the second pattern layer so as to be provided as a routing line for a high-speed transmission line, and a remote signal line pattern of the third pattern layer is provided as for example a power distribution network (PDN) line, and therefore better advantages than the basic structure of FIG. 1 with respect to the EMI control are exhibited.

In addition, referring to the seven-layered structure of FIG. 3, a plurality of grounds may be provided in the second pattern layer 30, the fourth pattern layer 130, and the sixth pattern layer 230, and therefore a minimum number of layers enabling to realize an optimized result in terms of electrical characteristics may be obtained. Therefore, a significantly low ground impedance may be accordingly provided in, for example, a power line of the first pattern layer 10, signal lines of the third and fifth pattern layers 50 and 150, and a signal or power line of the seventh pattern layer 250.

Next, an RF module according to the second embodiment of the present invention will be described in detail with reference to drawings. The present embodiments will be described with reference to the asymmetrical multilayer substrate according to the first embodiment and FIGS. 1 to 7B, and thus repeated descriptions will be omitted.

The RF module according to the second embodiment may use an asymmetrical multilayer substrate having an RF signal transmission line as a substrate of the RF module. In this instance, an RF chip and the like may be mounted on the asymmetrical multilayer substrate. In this instance, for example, an RF receiving chip may be mounted. As an example, the RF module may be used in mobile devices. Hereinafter, omitted description with respect to the asymmetrical multilayer substrate used in the RF module may be replaced with descriptions of the first embodiment described as above.

Referring to FIGS. 1 to 6, the asymmetrical multilayer substrate used in the RF module in the second embodiment includes a core layer 20, a first pattern layer 10, a second pattern layer 30, a first insulating layer 40 and a third pattern layer 50. In addition, referring to FIG. 2, on the first pattern layer 10, a laminated structure including the second insulating layer 120, the fourth pattern layer 130, the third insulating layer 140, and the fifth pattern layer 150 may be further laminated, and referring to FIG. 3, the laminated structure including the fourth insulating layer 220, the sixth pattern layer 230, the fifth insulating layer 240, and the seventh pattern layer 250 may be further laminated on the structure of FIG. 2. Also, as shown in FIG. 4B, protection layers 60 and 80 may be respectively formed above the third pattern layer 50 and below the first pattern layer 10. For example, other than the structure of three-layered structure of FIG. 4B, for example, even in a multi-layered structure of three-layers of more in FIGS. 2 and/or 3, protection layers may be formed on the outermost pattern layers in the same manner as that of the FIG. 4B.

Hereinafter, when describing the asymmetrical multilayer substrate, the core layer 20, the first pattern layer 10, the second pattern layer 30, the first insulating layer 40 and the third pattern layer 50 will be described in the stated order.

The core layer 20 of the asymmetrical multilayer substrate includes a through-hole 20a. The through-hole 20a connects the first signal line pattern 11 of the first pattern layer 10 and the second routing line pattern 33 of the second pattern layer 30.

Also, the first pattern layer 10 is formed over or below the core layer 20. As an example, the first signal line pattern 11 may receive signals from the second routing line pattern 33 through the through-hole 20a. In this instance, an impedance of the first signal line pattern 11 may be smaller than that of the third signal line pattern 51 of the third pattern layer 50.

For example, referring to FIGS. 4A, 4B, 5, 7A and 7B, the first pattern layer 10 may further include a first metal plate 12 disposed so as to have a second capacitance (see, $C_{23}$ of FIG. 5) between the first signal line pattern 11 connected with the through-hole 20a and the second metal plate 31 of the second pattern layer 30. In this instance, the second capacitance (see, $C_{23}$ of FIG. 5) between the first metal plate 12 and the second metal plate 31 of the second pattern layer 30 may form a part of the overall parasitic capacitance at the time of signal transmission from the third signal line pattern 51 to the first signal line pattern 11, and form a part of an impedance transformation circuit for impedance matching of the third signal line pattern 51 and the first signal line pattern 11. The first metal plate 12 provides a capacitance between the second metal plate 31 and the first metal plate 12, and may be, for example, a ground pattern or another signal line.

As an example, each of the second metal plate 31 and the first metal plate 12 may act as a ground, and the ratio of each of the second metal plate 31 and the first metal plate 12 to a thickness of the core layer 20 or a height of the through-hole 20a may be about 1:1.

Also, the second pattern layer 30 may be formed on the core layer 20 opposite to the first pattern layer 10. In this instance, the second pattern layer 30 includes the second metal plate 31 which provides a first capacitance (see, $C_{12}$ of FIG. 5) between the third signal line pattern 51 of the third pattern layer 50 and the second metal plate 31, and a second routing line pattern 33 which is connected to the through-hole 20a. The third signal line pattern 51 is a signal transmission line which is sensitive to noise, so that a closed coupling with respect to a reference ground may be required to reduce an EMI and a noise level. The second metal plate 31 provides a capacitance between the third signal line pattern 51 and the second metal plate 31, and may be, for example, a ground pattern or another signal line.

For example, the second routing line pattern 33 is a signal transmission line which is sensitive to noise, so that a closed coupling with respect to a reference ground may be required to reduce an EMI and a noise level. Accordingly, as an example, the second routing line pattern 33 may achieve the closed coupling with the third metal plate 53 of the third pattern layer 50. Also, the second metal plate 31 provides the second capacitance (see, $c_{23}$ of FIG. 5) between the first metal plate 12 and the second metal plate 31, and adjusts the overall parasitic capacitance generated at the time of signal transmission from the third signal line pattern 51 to the first signal line pattern 11. In this instance, the second capacitance (see, $c_{23}$ of FIG. 5) may form a part of the impedance transformation circuit for impedance matching of the third signal line pattern 51 and the first signal line pattern 11 as a part of the overall parasitic capacitance.

As an example, the width of the second metal plate 31 may be substantially the same as that of the first metal plate 12. In this instance, the ratio of the width of each of the second metal plate 31 and the first metal plate 12 to the thickness of the core layer 20 or the height of the through-hole 20a may be about 1:1.

Also, as an example, the second metal plate 31 may act as a ground with respect to the third signal line pattern 51 of the third pattern layer 50, and may form a micro-strip line together with the third signal line pattern 51. In this instance, the ratio of the width of the third signal line pattern 51 to the height of the first via 40a or a thickness of the first insulating layer 40 between the third pattern layer 50 and the second pattern layer 30 may be about 1:1.

Also, referring to FIGS. 1 to 4B, the first insulating layer 40 is formed on the second pattern layer 30 with the thickness t2 that is thinner than the thickness t1 of the core layer 30. The first via 40a that conducts the second routing line pattern 33 of the second pattern layer 30 and the third signal line pattern 51 of the third pattern layer 50 is formed on the first dielectric layer 40. In this instance, together with the second routing line pattern 33 and the through-hole 20a, the first via 40a may form an impedance load 100 or 100a that is a part of the impedance transformation circuit for impedance matching in the signal transmission between the third signal line pattern 51 and the first signal line pattern 11.

The third pattern layer 50 may be formed over the second pattern layer 30 interposing the first dielectric layer 40. In this instance, the third pattern layer 50 includes a third signal line pattern 51 which is connected with the second routing line pattern 33 through the first via 40a formed on the first dielectric layer 40. In this instance, an impedance of each of the second routing line pattern 33 and the first signal line pattern 11 may be smaller than an impedance of the third signal line pattern 51.

The third signal line pattern 51 may be a signal transmission line which is sensitive to noise, so that a closed coupling with respect to the reference ground may be required to reduce the EMI and the noise level. Accordingly, the third signal line pattern 51 may achieve the closed coupling with the second metal plate 31 of the intermediate metal layer 30. In this instance, the third signal line pattern 51 may have the second capacitance (see, $C_{23}$ of FIG. 5) between the second metal plate 31 and the third signal line pattern 51.

As an example, referring to FIGS. 4A, 4B, 5, 7A and 7B, the third pattern layer 50 may further include the third metal plate 53 which provides a capacitance between the second routing line pattern 33 and the third metal plate 53. The third metal plate 53 provides a capacitance between the second routing line pattern 33 and the third metal plate 53, and may be, for example, a ground pattern or another signal line.

Also, as an example, the third signal line pattern 51 of the third pattern layer 50 may form a micro-strip line together with the second metal plate 31, and the third metal plate 53 may adjust an impedance of the second routing line pattern 33 constant.

In a typical asymmetric build-up structure, impedance transformation of signal lines in an interconnection routing from the third pattern layer 50 to the first pattern layer 10 may occur a high signal loss and substantial performance degradation in a signal transmission system, so that impedance transformation of interconnection between layers may be required to be improved. Accordingly, the asymmetrical multilayer substrate may include an impedance transformation circuit that is formed by the impedance load (see, Zt of FIG. 6) of the through-hole 20a, the second routing line pattern 33, and the first via 40a, and the parasitic capacitance load for implementing the matching impedance by adjusting the capacitance value of the impedance transformation circuit, for example, the capacitance load (see, Ct of FIG. 6) by the second metal plate 31 and the first metal plate 12, as an impedance transformation circuit for impedance matching of the third signal line pattern 51 and the first signal line pattern 11.

In this instance, referring to FIGS. 5 and 6, as an example, the capacitance load (see, $C_t$ of FIG. 6) by the second metal plate 31 and the first metal plate 12 may correspond to a parallel capacitance value of the first capacitance (see, $C_{12}$ of FIG. 5) between the second metal plate 31 and the third signal line pattern 51 and the second capacitance (see, $C_{23}$ of FIG. 5) between the second metal plate 31 and the first metal plate 12.

Hereinafter, a method for manufacturing an asymmetrical multilayer substrate according to third embodiments of the present invention will be described in detail with reference to drawings. The present embodiments will be described with reference to the above described embodiments of the asymmetrical multilayer substrate and FIGS. 1 to 7B as well as FIGS. 8A to 12, and thus repeated descriptions will be omitted.

Figure 8A:
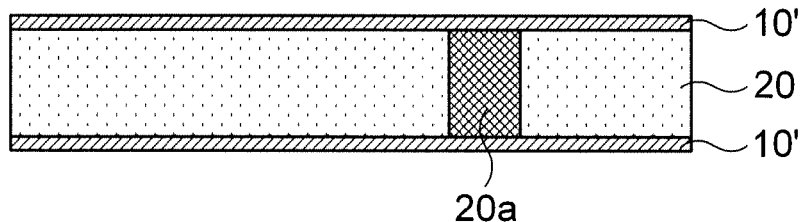
FIGS. 8A to 8E are cross-sectional diagrams schematically showing a process for manufacturing an asymmetrical multilayer substrate according to an exemplary embodiment of the present invention.
Figure 8B:
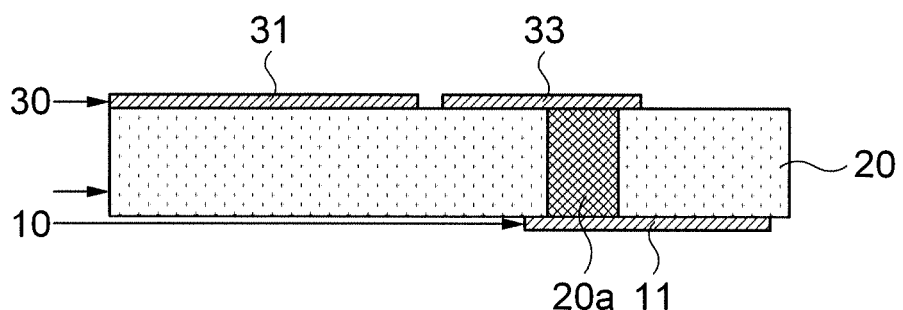
Figure 8C:
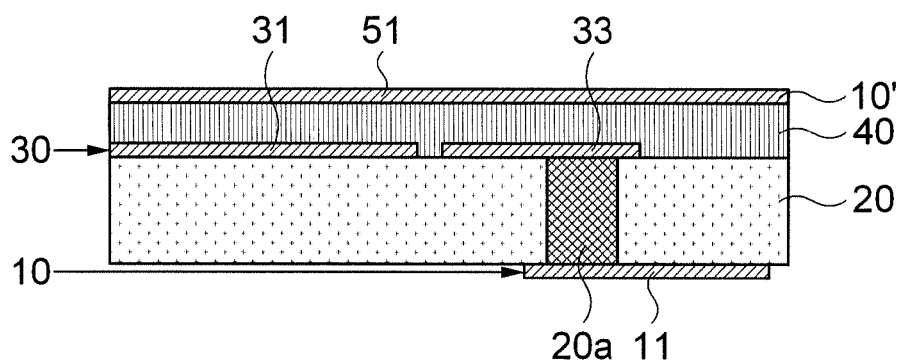
Figure 8D:
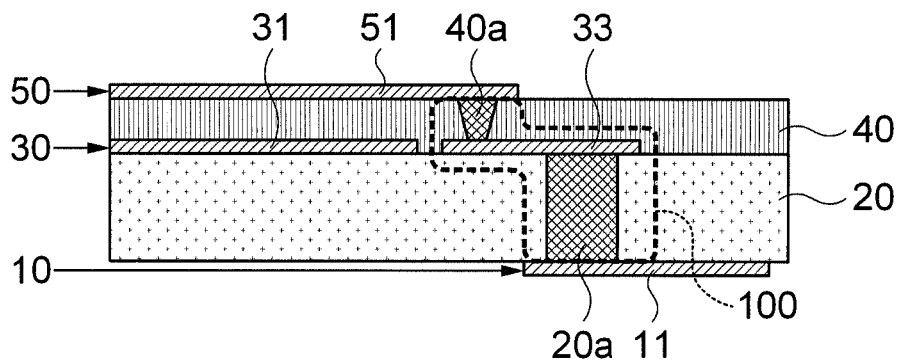
Figure 8E:
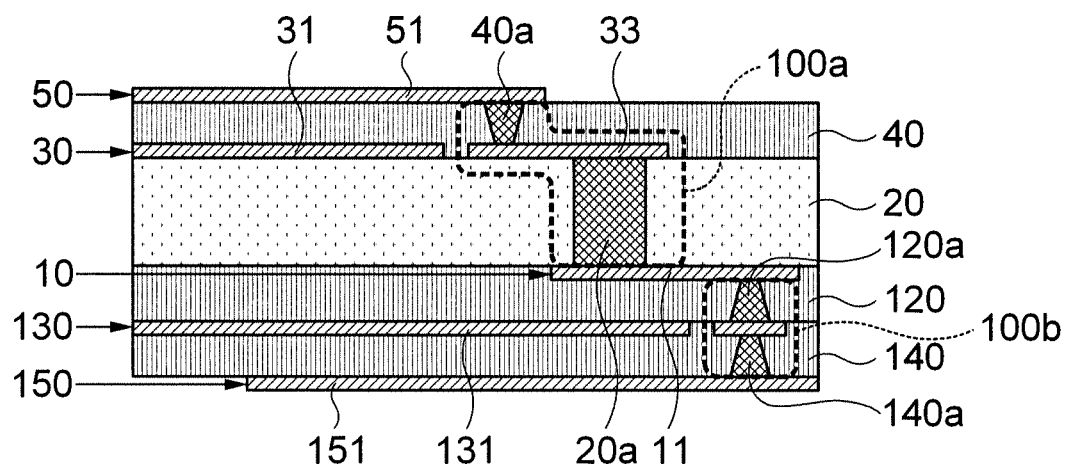
Figure 9:
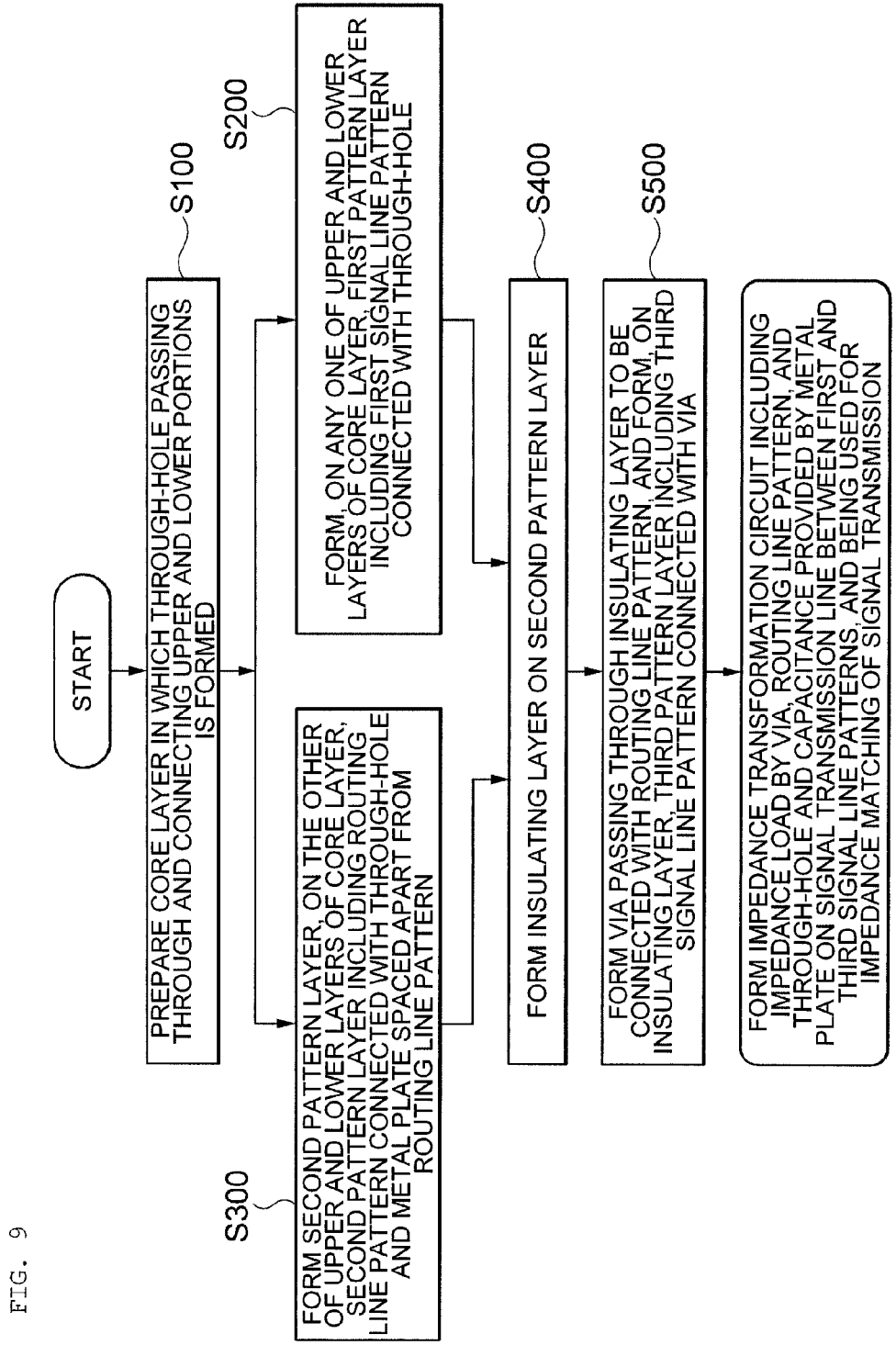
FIG. 9 is a flowchart schematically showing a method for manufacturing an asymmetrical multilayer substrate according to an exemplary embodiment of the present invention.
Figure 10:
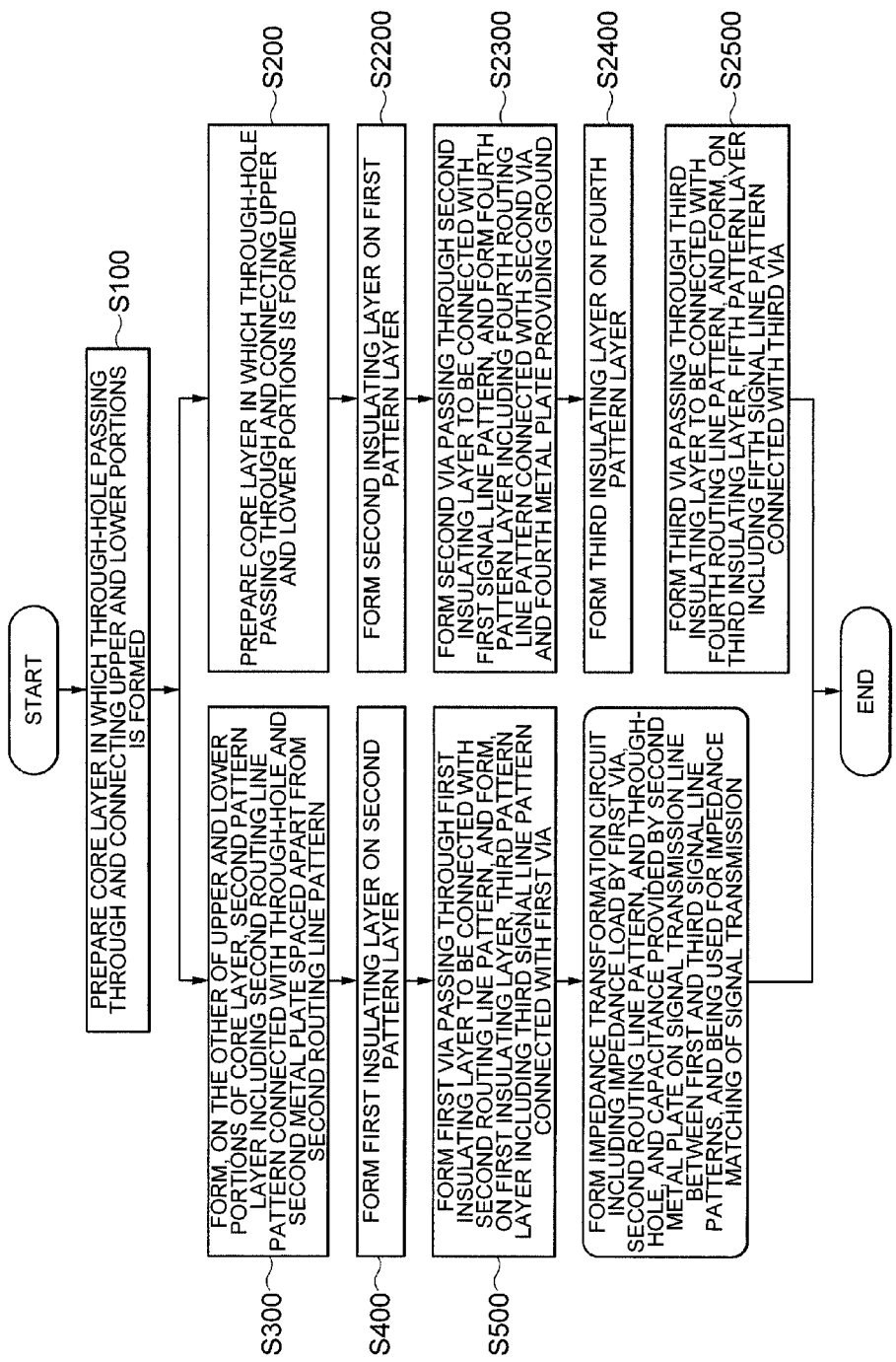
FIG. 10 is a flowchart schematically showing a method for manufacturing an asymmetrical multilayer substrate according to another exemplary embodiment of the present invention.
Figure 11:
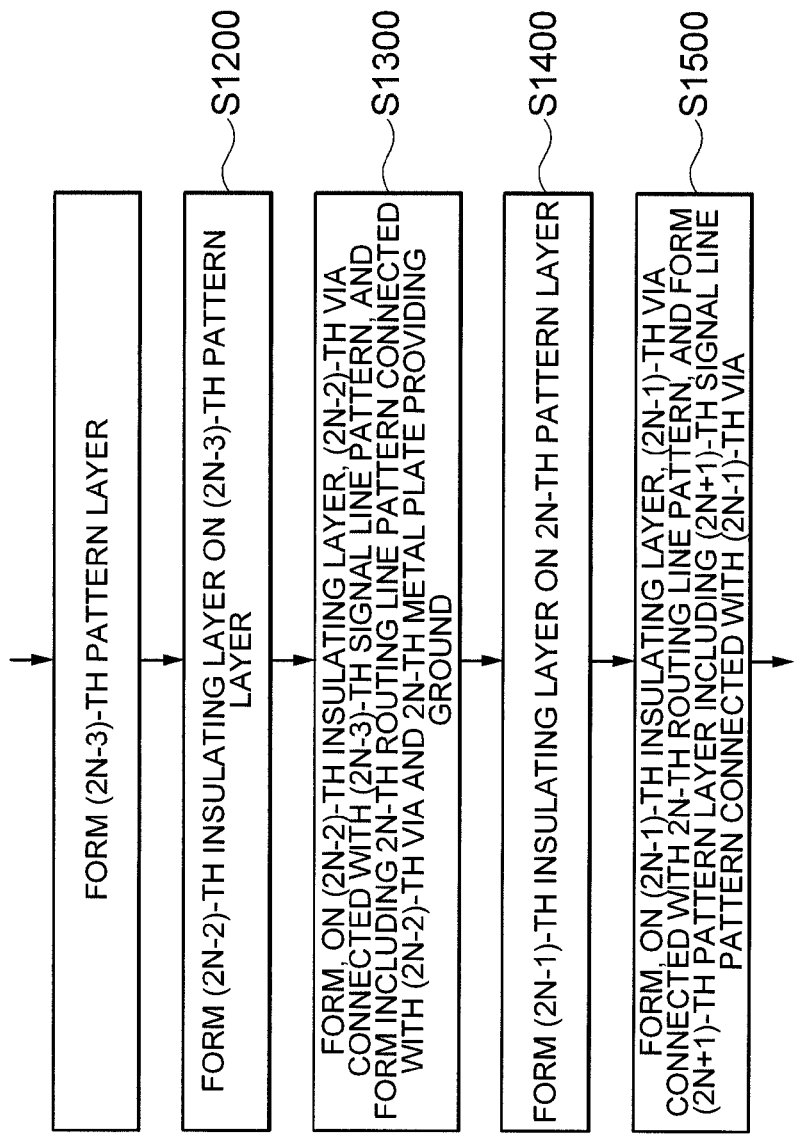
FIG. 11 is a flowchart schematically showing a build-up process of a designated build-up structure in a method for manufacturing an asymmetrical multilayer substrate according to an exemplary embodiment of the present invention.
Figure 12:
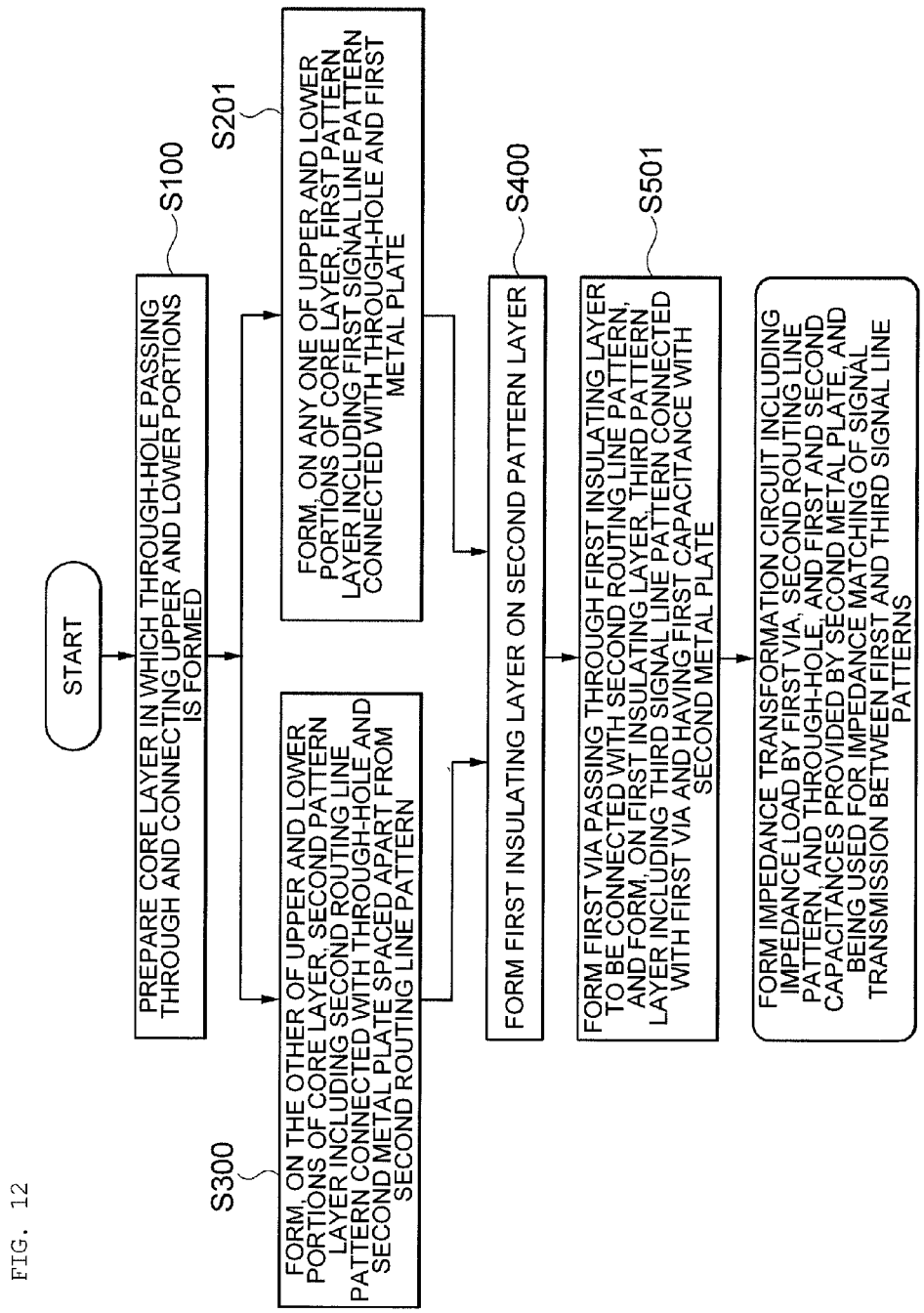
FIG. 12 is a flowchart schematically showing a method for manufacturing an asymmetrical multilayer substrate according to an exemplary embodiment of the present invention.

FIGS. 8A to 8E are cross-sectional diagrams schematically showing a process for manufacturing an asymmetrical multilayer substrate according to an exemplary embodiment of the present invention, FIG. 9 is a flowchart schematically showing a method for manufacturing an asymmetrical multilayer substrate according to an exemplary embodiment of the present invention, FIG. 10 is a flowchart schematically showing a method for manufacturing an asymmetrical multilayer substrate according to another exemplary embodiment of the present invention, FIG. 11 is a flowchart schematically showing a build-up process of a designated build-up structure in a method for manufacturing an asymmetrical multilayer substrate according to an exemplary embodiment of the present invention, and FIG. 12 is a flowchart schematically showing a method for manufacturing an asymmetrical multilayer substrate according to another exemplary embodiment of the present invention.

Referring to FIGS. 8A to 8D, 10 and 12, the method for manufacturing the asymmetrical multilayer substrate according to the third embodiment includes forming a core layer (see FIG. 8A and S100), forming a first pattern layer (see, FIG. 8B, S200 and S201), forming a second pattern layer (see FIG. 8B and S300), forming a first dielectric layer (see FIG. 8C and S400), and forming a first via and a third pattern layer (see FIG. 8D, S500 and S501).

Referring to FIGS. 8A, 9, 10 and 12, in the forming of the core layer S100, the core layer 20 including a through-hole 20a penetrating and connecting over and below thereof is prepared. In this instance, referring to FIG. 8A, a conductive metal layer for forming a pattern layer, for example, a copper foil layer 10' may be attached to the upper and lower portions of the core layer 20. For example, the core layer 20 may be made of a general core material, for example, a core material with a low loss material, and the invention is not limited thereto.

For example, in the forming of the core layer (see FIG. 8A and S100), a thickness of the core layer 20 is thicker than a thickness of the first insulating layer 40, thereby manufacturing the asymmetrical multilayer substrate.

Next, referring to FIGS. 8B, 9, 10 and 12, in the forming of the first pattern layer S200 or S201, the first pattern layer 10 is formed on one side of upper and lower side of the core layer 20. Also, referring to FIGS. 8B, 9, 10 and 12, in the forming of the second pattern layer S300, the second pattern layer 30 is formed on the other side of upper and lower side of the core layer 20. That is, the first pattern layer 10 is formed on one side of the upper and lower portions of the core layer 20, and the second pattern layer 30 is formed on the other side thereof. In this instance, the forming of the first pattern layer (see FIG. 8B, and S200 and S201) and the forming of the second pattern layer (see FIG. 8B and S300) may be sequentially carried out in a single process. In the forming of the first, the second, and the third pattern layers 10, 20, and 30, each pattern may be formed by one or more methods among a variety of processes for forming patterns.

First, referring to FIGS. 8B, 9, 10 and 12, the forming of the first pattern layer S200 or S201 is described. In this instance, the first pattern layer 10 includes a first signal line pattern which is connected with the through-hole 20a. Referring to FIG. 8B, by processing the conductive metal layer formed on the upper or lower portions of the core layer 20, for example, the copper foil layer 10', the first signal line pattern 11 connected with the through-hole 20a is formed. In this instance, the first signal line pattern 11 is formed in a manner such that an impedance of the first signal line pattern is smaller than that of the third signal line pattern 51 which will be formed later. The first signal line pattern 11 may include a stripe line. The first signal line pattern 11 may be, for example, a PDN (Power Distribution Network) pattern or another signal wiring pattern.

For example, an impedance of the first signal line pattern 11 formed on the core layer 20 may be smaller than an impedance of the third signal line pattern 51 formed on the first insulating layer 40.

Referring to FIG. 12, as an example, in the forming of the first pattern layer in S210, the first pattern layer 10 including the first signal line pattern 11 and the first metal plate 12 facing the second metal plate 31 may be formed. In this instance, the first metal plate 12 has a second capacitance (see, $C_{23}$ of FIG. 5) between the first metal plate 12 and the second metal plate 31 of the second pattern layer 30 which will be formed later, and the second capacitance (see, $C_{23}$ of FIG. 5) may form a part of an impedance transformation circuit for impedance matching of the third signal line pattern 51 and the first signal line pattern 11. In this instance, the first metal plate 12 may be a ground pattern or another signal transmission line pattern.

Also, as an example, the first signal line pattern 11 may be formed in a manner such that the ratio of a width of the first signal line pattern 11 to a thickness of the core layer 20 or a height of the through-hole 20a may be substantially 1:1.

Next, referring to FIGS. 8B, 9, 10 and 12, the forming of the second pattern layer S300 is described. In the forming of the second pattern layer (see FIG. 8B and S300), the second pattern layer 30 is formed on an opposite side of the first pattern layer 10 with respect to the core layer 20. In this instance, the second pattern layer 30 includes a second metal plate 31 and a second routing line pattern 33. The second metal plate 31 is formed so as to provide a capacitance with a pattern of an adjacent outer pattern layer. In this instance, the second metal plate 31 is arranged so that a first capacitance (see, $C_{12}$ of FIG. 5) between the third signal line pattern 51 of the third pattern layer 50 and the second metal plate 31 could be formed. For example, the second metal plate 31 may act as a ground with respect to the third signal line pattern 51. The second metal plate 31 provides the first capacitance (see, $C_{12}$ of FIG. 5) between the third signal line pattern 51 and the second metal plate 31, and may be, for example, a ground pattern or another signal transmission line. The second routing line pattern 33 is formed to be connected with the first signal line pattern 11 through the through-hole 20a. In this instance, the second routing line pattern 33 may be formed in a manner such that an impedance of the second signal line of the second routing line pattern 33 is smaller than an impedance of the third signal line pattern 51 which will be formed later. The second routing line pattern 33 may include a stripe line.

For example, referring FIG. 12, in case that in the forming of the first pattern layer S201 the first metal plate 12 is formed, in the forming of the second pattern layer S300 the second metal plate 31 is arranged so that a second capacitance (see, $C_{23}$ of FIG. 5) between the first metal plate 12 and the second metal plate 31 could be formed. For example, in this instance, a parasitic capacitance load (see $C_t$ of FIG. 6) in which a first capacitance formed between the third signal line pattern 51 of the third pattern layer 50, which will be formed later, and the second metal plate 31, and a second capacitance formed between the second metal plate 31 and the first metal plate 12 are parallel to each other is formed, and therefore a part of the impedance transformation circuit for impedance matching in the signal transmission between the third signal line pattern 51 and the first signal line pattern 11 may be configured together with the impedance loads 100 or 100a by the first via 40a, the second routing line pattern 33, and the through-hole 20a.

As an example, a width of each of the second metal plate 31 and the first metal plate 12 may be substantially the same, and the ratio of the width of each of the second metal plate 31 and the first metal plate 12 to the thickness of the core layer 20 or the height of the through-hole 20a may be substantially 1:1.

Next, referring to FIGS. 8C, 9, 10 and 12, the forming of the first dielectric layer (see, FIG. 8C and S400) is described. In the forming of the first dielectric layer (see, FIG. 8C and S400), the first insulating layer 40 having the thickness t2 thinner than the thickness t1 of the core layer 20 is laminated on the second pattern layer 30. The first insulating layer 40 may be formed by laminating a prepreg (PPG) or the like, for example, by heating and squeezing by a press, or using other substrate insulating material. For example, referring to FIG. 8C, in the forming of the first insulating layer, the conductive metal layer for forming the pattern layer on the first insulating layer 40, the copper foil layer 10' may be attached to the upper portion of the first insulating layer 40. Alternatively, unlike FIG. 8C, in the forming of the first via and the third pattern layer, the conductive metal layer, for example, the copper foil layer may be attached on the first insulating layer 40.

Referring to FIG. 4B, in case of manufacturing an asymmetric substrate having three-layered structure, the protection layer 80 formed below the first pattern layer 10 may be simultaneously or sequentially formed. And, after the following forming of the first via and the third pattern layer, the protection layer 60 may be formed above the third pattern layer 50. For example, referring to the structure of FIGS. 2 and/or 3 or FIG. 10, in S2200, the third insulating layer 120 may be formed simultaneously with the forming of the first insulating layer S400 or sequentially on the first pattern layer 10.

Next, referring to FIGS. 8D, 9, 10 and 12, the following forming of the first via and the third pattern layer is described. In this instance, the forming of the first via and the third pattern layer (see, FIG. 8D, S500 and S501) may comprise a forming of the first via 40a and a forming of the third pattern layer 50 including a third signal line pattern 51. In the forming of the first via 40a, a via hole passing through the first insulating layer 40 is required to be processed before the forming of the first via 40a made of a conductive material. The via hole may be processed in the forming S400 of the first insulating layer or the forming (see FIG. 8D, and S500 and S501) of the first via 40a. After the via hole is processed, in the forming of the first via 40a (see FIG. 8D, and S500 and S501), the first via 40a passing through the first insulating layer 40 and being connected with the second routing line pattern 33 is formed. In this instance, the first via 40a may configure the impedance loads 100 and 100a that is a part of the impedance transformation circuit for impedance matching in the signal transmission between the third signal line pattern 51 and the first signal line pattern 11 together with the second routing line pattern 33 and the through-hole 20a.

Also, in the forming of the third pattern layer (see, FIG. 8D, S500 and S501), the third pattern layer 50 including the third signal line pattern 51 connected with the first via 40a is formed above the first dielectric layer 40. In this instance, the third pattern layer 50 includes a third signal line pattern 51 which is connected with the second routing line pattern 33 through the first via 40a. For example, the third signal line pattern 51 may be formed in a manner such that an impedance of the third signal line pattern 51 is larger than an impedance of each of the second routing line pattern 33 and the first signal line pattern 11. The third signal line pattern 51 includes a stripe line.

Also, referring to FIG. 12 or the structure in FIGS. 4B, 5, 7A and 7B, as an example, in the forming of the third pattern layer (see, S501 in FIG. 12), the third pattern layer 50 including the third signal line pattern 51 and a third metal plate 53 may be formed. In this instance, the third metal plate 53 is formed in a manner such that a capacitance between the second routing line pattern 33 and the third metal plate 53 could be provided. The third metal plate 53 provides a capacitance between the second routing line pattern 33 and the third metal plate 53, and may be, for example, a ground pattern or another signal transmission line. For example, the third metal plate 53 may be formed so as to adjust the impedance of the second routing line pattern 33 of the second pattern layer 30 constant.

As an example, the second metal plate 31 may act as a ground with respect to the third signal line pattern 51. In this instance, the third signal line pattern 51 may form a microstrip line together with the second metal plate 31.

Also, as an example, the width of the third signal line pattern 51 may be smaller than that of each of the second routing line pattern 33 and the first signal line pattern 11. For example, the third signal line pattern 51 is formed in a manner such that the ratio of the width of the third signal line pattern 51 to a thickness of the first insulating layer 40 between the third signal line pattern 51 and the second metal plate 31 or the height of the first via 40a is substantially 1:1.

In a typical asymmetric build-up structure, impedance transformation of signal lines in an interconnection routing from the third pattern layer 50 to the first pattern layer 10 may incur a high signal loss and substantial performance degradation in a signal transmission system, such that impedance transformation of an interconnection between layers may be required to be improved.

In the embodiments of the present invention, in order to improve mismatch on the routing line of the signal transmission between the signal line patterns formed vertically on the core layer and to match the impedance, the impedance transformation circuit is formed. The impedance transformation circuit includes an impedance load on the transmission line in the signal transmission between the signal line patterns formed vertically on the core layer 20 and a parasitic capacitance load on the transmission line. In this instance, the impedance load 200 may include an impedance of the through hole 20a forming the transmission line, the second routing line pattern 33, and the first via 40a. In addition, the parasitic capacitance load is used for implementing the matching impedance by adjusting the capacitance value of the impedance transformation circuit, and may include a parasitic capacitance with respect to the signal line pattern(s) formed in the upper or/and lower side direction(s) of the core layer and composed of an input side or/output side of signal transmission. For example, the parasitic capacitance load may include a capacitance provided by the second metal plate 31.

For example, referring to FIGS. 9, 10 and 12, an impedance transformation circuit for impedance matching in the signal transmission between the third signal line pattern 51 and the first signal line pattern 11 may be formed by an impedance load (see, Zt of FIG. 6) of the through-hole 20a, the second routing line pattern 33, and the first via 40a, and a capacitance load (see, Ct of FIG. 6) by the second metal plate 31.

Also, referring to FIGS. 5 and 6, as an example, the capacitance load (see, Ct of FIG. 6) by the second metal plate 31 and the first metal plate 12 may correspond to a parallel capacitance value of the first capacitance (see, $C_{12}$ of FIG. 5) between the second metal plate 31 and the third signal line pattern 51, and the second capacitance (see, $C_{23}$ of FIG. 5) between the second metal plate 31 and the first metal plate 12.

In addition, as an example, in the forming of the third pattern layer (see, FIG. 8D, S500 and S501), the third pattern layer 50 may be formed in a manner such that the third signal line pattern 51 forms a micro-strip line together with the second metal plate 31. Also, the third pattern layer 50 may be formed in a manner such that the third metal plate 53 adjusts the impedance of the second routing line pattern 33 constant.

In addition, as an example, referring to FIG. 4B, in a method for manufacturing the as the asymmetric multilayer structure, the protection layers 60 and 80 for protecting patterns of pattern layers may be formed on both outermost pattern layers.

Next, referring to FIGS. 8E, 10, and 11, a method for manufacturing the asymmetric multilayer structure according to an embodiment will be described. Referring to FIG. 10, the method for manufacturing the asymmetric multilayer structure may further include forming the second insulating layer in S2200, forming the second via 120a and the fourth pattern layer 130 in S2300, forming the third insulating layer 140 in S240, and forming the third via 140a and the fifth pattern layer 150 in S2500. Referring to FIG. 8E, the second insulating layer 120 including the second via 120a is formed on the first pattern 10, the fourth pattern layer 130 is formed on the second insulating layer 120, the third insulating layer 140 including the third via 140a is formed on the fourth pattern layer 130, and the fifth pattern 150 is formed on the third insulating layer 140.

In this instance, further referring to the structure of FIGS. 2 and 3 and FIG. 11, the method for manufacturing the asymmetric multilayer structure will be described. Referring to FIG. 11, in an example, the method for manufacturing the asymmetric multilayer structure may further include alternately laminating a predetermined build-up structure vertically with respect to the core layer 20 on an outermost pattern layer of a lamination previously laminated. Accordingly, an asymmetric multilayer structure of 2N+1 layers may be formed by the first to (2N+1)-th pattern layer. In this instance, N is a natural number of 2 or more, and the predetermined build-up structure may be alternately laminated by N−1 times along with an increase in N. For example, FIG. 10 shows an example of when N is 2, and the predetermined build-up structure is laminated once.

Referring to FIG. 11, the laminating once of the predetermined build-up structure may include forming a (2N−2)-th insulating layer in S1200, forming a (2N−2)-th via and a 2N-th pattern layer in S1300, forming a (2N−1)-th insulating layer in S1400, and forming a (2N−1)-th via and a (2N+1)-th pattern layer in S1500.

In the forming S1200 of the (2N−2)-th insulating layer, a (2n−2)-th insulating layer is formed on a (2N−3)-th pattern layer that is the outermost pattern layer of the lamination previously laminated so as to have a thinner thickness than a thickness of the core layer 20. Referring to FIGS. 2 and 10, when N=2, the second insulating layer 120 that is the (2N−2)-th insulating layer is formed on the first pattern layer 10 that is the (2N−3)-th pattern layer. In this instance, the first pattern layer 10 is one of the outermost patterns of the lamination previously laminated.

Next, in the forming S1300 of the (2N−2)-th via and the 2N-th pattern layer, the (2N−2)-th via connected with the (2N−3)-th signal line pattern passes through the (2N−2)-th insulating layer and is connected with a (2N−3)-th signal line pattern included in the (2N−3)-th pattern layer. In addition, the 2N-th pattern layer including a 2N-th routing line pattern and a 2N-th metal plate is formed on the (2N−2)-th insulating layer. In this instance, the 2N-th routing line pattern is connected with the (2N−2)-th via, and the 2N-th metal plate is formed to provide a ground with respect to a pattern of an adjacent pattern layer. For example, when N=2, referring to FIGS. 2 and 10, the second via 120a that is the (2N−2)-th via passes through the second insulating layer 120 that is the (2N−2)-th insulating layer and is connected with the first signal line pattern 11. In addition, the fourth pattern layer 130 that is the 2N-th pattern layer is formed on the second insulating layer 120. The fourth routing line pattern 131 that is the 2N-th routing line pattern is connected with the second via 120a, the fourth metal plate 133 that is the 2N-th metal plate may provide a ground between the adjacent fifth pattern 150 and first pattern layer 10 so as to shield the fifth pattern 150 and first pattern layer 10. In addition, the fourth metal plate 133 that is the 2N-th metal plate may be formed so as to have a predetermined capacitance with the fifth pattern layer 150 which will be formed later, for example, the fifth signal line pattern 151, and formed so as to have a predetermined capacitance with the first signal line pattern 11 of the first pattern layer 10.

Next, in the forming S1400 of the (2N−1)-th insulating layer, the (2N−1)-th insulating layer is formed on the 2N-th pattern layer so as to have a thinner thickness that a thickness of the core layer 20. In this instance, when N=2, referring to FIGS. 2 and 10, the third insulating layer 140 that is the (2N−1)-th insulating layer is formed on the fourth pattern layer 130.

Next, in the forming S1500 of the (2N−1)-th via and the (2N+1)-th pattern layer, the (2N−1)-th via passing through the (2N−1)-th insulating layer and being connected with the 2n-th routing line pattern is formed. In addition, on the (2N−1)-th insulating layer, the (2N+1)-th pattern layer including the (2N1)-th signal line pattern connected with the (2N−1)-th via is formed. In this instance, when N=2, the third via 140a that is the (2N−1)-th via passes through the third insulating layer 140 that is the (2N−1)-th insulating layer, and is connected with the fourth routing line pattern 131. The fifth signal line pattern 151 that is the (2N+1)-th signal line pattern is connected with the third via 140a on the third insulating layer 140 that is the (2N−1)-th insulating layer.

In this instance, the insulating layers having the same sequence number in the upper and lower side directions with respect to the core layer are simultaneously or sequentially laminated 20. In this instance, the "sequentially laminated" denote being sequentially laminated over time in such a manner that another process is inserted during the corresponding process as well as being continuously laminated.

For example, in FIG. 2, the first insulating layer 20 and the second insulating layer 120 may be simultaneously and vertically laminated, or sequentially laminated. In addition, the pattern layers having the same sequence number may be sequentially formed in the same process with respect to the core layer, or formed in the sequential process. For example, in FIG. 2, the third pattern layer 50 and the fourth pattern layer 130 may be sequentially formed in the same process, or formed in a sequential process.

In this instance, as an example, the impedance load on the transmission line may be an impedance load by at least two vias including the first via 40a, at least one routing line pattern including the second routing line pattern 33, at least one signal line pattern, and the through-hole 20a, which are formed on a routing line between signal line patterns forming input and output terminals of the signal transmission. In addition, the parasitic capacitance load on the transmission line may be a capacitance load by the capacitance provided by the second metal plate 31 and capacitances provided by at least one metal plate providing the grounds between itself and the signal line patterns forming the input and output terminals of the signal transmission.

In addition, although not shown, when manufacturing the asymmetrical multilayer substrate of five layers or more, an upper protection layer and a lower protection layer may be respectively formed on the outermost pattern layers after the outermost pattern is formed, in the same manner as that of FIG. 4B.

As set forth above, according to the embodiments of the present invention, there is provided the asymmetrical multilayer substrate having odd pattern layers of asymmetric structure and forming in high density.

In addition, a standard impedance control may be made possible through the impedance transformation circuit, measures of EMI may be established through at least one ground trace, and impedance matching for optimized signal integrity may be implemented in high-speed signal transmission.

It is obvious that various effects directly stated according to various exemplary embodiment of the present invention may be derived by those skilled in the art from various configurations according to the exemplary embodiments of the present invention.

The accompanying drawings and the above-mentioned exemplary embodiments have been illustratively provided in order to assist in understanding of those skilled in the art to which the present invention pertains. In addition, the exemplary embodiments according to various combinations of the aforementioned configurations may be obviously implemented by those skilled in the art from the aforementioned detailed explanations. Therefore, various exemplary embodiments of the present invention may be implemented in modified forms without departing from an essential feature of the present invention. In addition, a scope of the present invention should be interpreted according to claims and includes various modifications, alterations, and equivalences made by those skilled in the art.

What is claimed is:

1. An asymmetrical multilayer substrate comprising:
a core layer in which a through-hole for passing through and connecting upper and lower portions thereof is formed;
a first pattern layer formed on one of upper and lower portions of the core layer, and including a first signal line pattern connected with the through-hole;
a second pattern layer formed on the other of the upper and lower portions of the core layer, and including a second metal plate providing a capacitance between itself and a pattern of an adjacent outer pattern layer and a second routing line pattern connected with the through-hole;
a first insulating layer formed on the second pattern layer so as to have a thinner thickness than a thickness of the core layer, and including a first via connected with the second routing line pattern; and
a third pattern layer formed on the first insulating layer, and including a third signal line pattern connected with the first via,
wherein an impedance transformation circuit including an impedance load on a transmission line and a parasitic capacitance load on the transmission line is formed for impedance matching in signal transmission between the signal line patterns formed in the upper and lower side directions of the core layer, and the impedance load includes impedances of the through-hole, the second routing line pattern, and the first via which are forming the transmission line, and the parasitic capacitance load includes the capacitance provided by the second metal plate.

2. The asymmetrical multilayer substrate according to claim 1, wherein the first pattern layer further includes a first metal plate facing the second metal plate, the parasitic capacitance load is a parallel parasitic capacitance load of first and second capacitances formed between the second metal plate and each of the third signal line pattern and the first metal plate, the third pattern layer further includes a third metal plate providing a capacitance between itself and the second routing line pattern, and an impedance of each of the first signal line pattern and the second routing line pattern is smaller than an impedance of the third signal line pattern.

3. The asymmetrical multilayer substrate according to claim 2, wherein the third signal line pattern forms a microstrip line together with the second metal plate, and the third metal plate is formed to adjust an impedance of the second routing line pattern.

4. The asymmetrical multilayer substrate according to claim 2, wherein a width of each of the second metal plate and the first metal plate is larger than a width of the third signal line pattern.

5. The asymmetrical multi layer substrate according to claim 1, further comprising:
a predetermined build-up structure comprising N laminated layers on one of upper and lower portions of the core layer and comprising N−1 laminated layers on the other of the upper and lower portions of the core layer, with N being a natural number of 2 or more,
wherein the predetermined build-up structure including a (2N−2)-th insulating layer formed on a (2N−3)-th pattern layer so as to have a thinner thickness than the thickness of the core layer and including a (2N−2)-th via connected with a (2N−3)-th signal line pattern included in the (2N−3)-th pattern layer, a 2N-th pattern layer formed on the (2N−2)-th insulating layer and including a 2N-th routing line pattern connected with the (2N−2)-th via and a 2N-th metal plate providing a ground, a (2N−1)-th insulating layer formed on the 2N-th pattern layer so as to have a thinner thickness than the thickness of the core layer and including a (2N−1)-th via connected with the 2N-th routing line pattern, and a (2N+1)-th pattern layer formed on the (2N−1)-th insulating layer and including a (2N+1)-th signal line pattern connected with the (2N−1)-th via,
and wherein asymmetrical layers of 2N+1 layers are formed by the first to the (2N+1)-th pattern layers.

6. The asymmetrical multilayer substrate according to claim 5, wherein the impedance load on the transmission line is an impedance load by at least two vias including the first via, at least one routing line pattern including the second routing line pattern, at least one signal line pattern, and the through-hole which are formed on a routing line between signal line patterns forming input and output terminals of the signal transmission, and the parasitic capacitance load on the transmission line is a capacitance load by the capacitance provided by the second metal plate and capacitances provided by at least one metal plate providing the grounds between itself and the signal line patterns forming the input and output terminals of the signal transmission.

7. The asymmetrical multilayer substrate according to claim 1, wherein the second metal plate forms a ground with respect to the third signal line pattern.

8. The asymmetrical multilayer substrate according to claim 7, wherein the parasitic capacitance load is a parallel capacitance formed between the second metal plate and each of the third and first signal line patterns.

9. The asymmetrical multilayer substrate according to claim 1, wherein the impedance of each of the first signal line pattern and the second routing line pattern which are formed on the upper and lower portions of the core layer is smaller than an impedance of the third signal line pattern formed on the first insulating layer.

10. The asymmetrical multilayer substrate according to claim 1, wherein the first pattern layer further includes a first metal plate facing the second metal plate, and the parasitic capacitance load is a parallel parasitic capacitance load of first and second capacitances formed between the second metal plate and each of the third signal line pattern and the first metal plate.

11. The asymmetrical multilayer substrate according to claim 1, wherein the asymmetrical multilayer substrate is used in a mobile device.

12. A method for manufacturing an asymmetrical multilayer substrate, the method comprising:
preparing a core layer in which a through-hole for passing through and connecting upper and lower portions thereof is formed;
forming, on one of upper and lower portions of the core layer, a first pattern layer including a first signal line pattern connected with the through-hole;
forming, on the other of the upper and lower portions of the core layer, a second pattern layer including a second metal plate providing a capacitance between itself and a pattern of an adjacent outer pattern layer and a second routing line pattern connected with the through-hole;
forming, on the second pattern layer, a first insulating layer having a thinner thickness than a thickness of the core layer; and
forming a first via passing through the first insulating layer to be connected with the second routing pattern, and forming a third pattern layer, on the first insulating layer, a third pattern layer including a third signal line pattern connected with the first via,
wherein an impedance transformation circuit including an impedance load on a transmission line and a parasitic capacitance load on the transmission line is formed for impedance matching in signal transmission between the signal line patterns formed in the upper and lower side directions of the core layer, and the impedance load includes impedances of the through-hole, the second routing line pattern, and the first via which are forming the transmission line, and the parasitic capacitance load includes the capacitance provided by the second metal plate.

13. The method according to claim 12, further comprising:
a predetermined build-up structure comprising N laminated layers on one of upper and lower portions of the core layer and comprising N−1 laminated lavers on the other of the upper and lower portions of the core layer, with N being a natural number of 2, or more,
wherein the predetermined build-up structure includes a (2N−2)-th insulating layer on a (2N−3)-th pattern layer having thinner thickness than a thickness of the core layer,
the method further comprising:
forming a (2N−2)-th via passing through the (2N−2)-th insulating layer and connected with a (2N−3)-th signal line pattern included in the (2N−3)-th pattern layer, and forming 2N-th pattern layer, on the (2N−2)-th insulating layer, including a 2N-th routing line pattern connected with the (2N−2)-th via and a 2N-th metal plate providing a ground,
forming, on the 2N-th pattern layer, a (2N−1)-th insulating layer having a thinner thickness than the thickness of the core layer, and
forming a (2N−1)-th via passing through the (2N−1)-th insulating layer and connected with the 2N-th routing line pattern, and a (2N+1)-th pattern layer, on the (2N−1)-th insulating layer, a (2N+1)-th pattern layer including a (2N+1)-th signal line pattern connected with the (2N−1)-th via, and
wherein the insulating layers having the same sequence number in the upper and lower side directions with respect to the core layer are simultaneously or sequentially laminated, the pattern layers having the same sequence number in the upper and lower side directions are sequentially laminated, and asymmetrical layers of 2N+1 layers are formed by the first to the (2N+1)-th pattern layers.

14. The method according to claim 13, wherein the impedance load on the transmission line is an impedance load by at least two vias including the first via, at least one routing line pattern including the second routing line pattern, at least one signal line pattern, and the through-hole which are formed on a routing line between signal line patterns forming input and output terminals of the signal transmission, and the parasitic capacitance load on the transmission line is a capacitance load by the capacitance provided by the second metal plate and capacitances provided by at least one metal plate providing the grounds between itself and the signal line patterns forming the input and output tenni:la:1s of the signal transmission.

15. The method according to claim 12, wherein
in the forming of the first pattern layer, the first pattern layer further includes a first metal plate facing the second metal plate,
in the forming of the third pattern layer, the third pattern layer further includes a third metal plate providing a capacitance with the second routing line pattern, and an impedance of the third signal line pattern of the third pattern layer is larger than an impedance of each of the first signal line pattern and the second routing line pattern, and
the parasitic capacitance load in which a first capacitance formed between the third signal line pattern of the third pattern layer and the second metal plate and a second capacitance formed between the second metal plate and the first metal plate are parallel to each other is formed.

16. The, method according to claim 15, wherein, in the forming of the third pattern layer, the third signal line pattern forms a micro-strip line together with the second metal plate, and the third metal plate is formed to adjust an impedance of the second routing line pattern.

17. The method according to claim 12, wherein the impedance of each of the first signal line pattern and the second routing line pattern which are formed on the upper and lower portions of the core layer is smaller than an impedance of the third signal line pattern formed on the first insulating layer.

18. The method according to claim 12, wherein the second metal plate forms a ground with respect to the third signal line pattern.

19. An RF module which uses an asymmetrical multilayer substrate in which an RF signal transmission line is formed, the asymmetrical multilayer substrate including:
a core layer in which through-hole for passing through and connecting upper and lower portions thereof is formed;
a first pattern layer formed on one of upper and lower portions of the core layer, and including a first signal line pattern connected with the through-hole;
a second pattern layer formed on the other of the upper and lower portions of the core layer, and including a second metal plate providing a capacitance between itself and a pattern of an adjacent outer pattern layer and a second routing line pattern connected with the through-hole;
a first insulating layer formed on the second pattern layer so as to have a thinner thickness than a thickness of the core layer and including a first via connected with the second routing line pattern; and a third pattern layer formed on the first insulating layer and including a third signal line pattern connected with the first via, wherein an impedance transformation circuit including an impedance load on a transmission line and a parasitic capacitance load on the transmission line is formed for impedance matching in signal transmission between the signal line patterns formed in the upper and lower side directions of the core layer, and the impedance load includes impedances of the through-hole, the second routing line pattern and the first via Which are forming the transmission line, and the parasitic capacitance load includes the capacitance provided by the second metal plate.

20. The RF module according to claim 19, wherein the first pattern further includes a first metal plate facing the second metal plate, the parasitic capacitance load is a parallel parasitic capacitance load of first and second capacitances formed between the second metal plate and each of the third signal line pattern and the first metal plate, the third pattern layer further includes a third metal plate providing a capacitance between itself and the second routing line pattern, and an impedance of each of the first signal line pattern and the second routing line pattern is smaller than an impedance of the third signal line pattern.

* * * * *